United States Patent [19]

Koloc

[11] Patent Number: 5,041,760
[45] Date of Patent: Aug. 20, 1991

[54] METHOD AND APPARATUS FOR GENERATING AND UTILIZING A COMPOUND PLASMA CONFIGURATION

[76] Inventor: Paul M. Koloc, Box 222, College Park, Md. 20740

[21] Appl. No.: 701,808

[22] Filed: Feb. 19, 1985

Related U.S. Application Data

[60] Continuation of Ser. No. 312,902, Oct. 19, 1981, abandoned, which is a continuation of Ser. No. 913,108, Jun. 6, 1978, abandoned, which is a continuation-in-part of Ser. No. 902,839, May 4, 1978, abandoned, which is a continuation of Ser. No. 706,454, Jul. 19, 1976, abandoned, which is a division of Ser. No. 409,060, Oct. 24, 1973, Pat. No. 4,023,065.

[51] Int. Cl.$^5$ ............................. G21B 1/00; H01J 7/24
[52] U.S. Cl. ................................ 315/111.41; 376/100; 376/121; 376/133; 376/128; 376/144; 376/146
[58] Field of Search ................. 376/100, 133, 127–130, 376/144–146, 121; 313/231.31; 315/111.21, 111.41

[56] References Cited

U.S. PATENT DOCUMENTS

| | | | |
|---|---|---|---|
| 3,107,211 | 10/1963 | Mallinckrodt | 176/1 |
| 3,303,097 | 2/1967 | Mallinckrodt | 176/1 |
| 3,321,664 | 5/1967 | Phillips et al. | 176/3 |
| 3,579,028 | 5/1971 | Paine | 176/3 |
| 3,886,402 | 5/1975 | Furth et al. | 176/3 |
| 4,023,065 | 5/1977 | Koloc | 176/3 |
| 4,182,650 | 1/1980 | Fischer . | |
| 4,182,651 | 1/1980 | Fischer . | |

FOREIGN PATENT DOCUMENTS 892344 3/1962 United Kingdom ................... 176/5

OTHER PUBLICATIONS

Soviet Physics-JETP, 1958, pp. 33–42, Shafranov.
"The Universe", by D. Bergamini, Time-Life Books, 1962, 1971, pp. 101–103.
Astrophysical J. vol. 133, 1961, pp. 1043–1048, Lindberg et al.
2nd U.N. Conf. Peaceful Uses of Atomic Energy, vol. 31, pp. 3–5, Alfven, 1958.
Phys. Fluids, vol. 7, 1964, pp. 826–832, Wells.
Atom Kernenergie, vol. 23, pp. 66–68, 1974, Fischer.
IAEA-CN-33/H8-2, pp. 141–145, 1975, Kurtmullaev et al.
IAEA-CN-33/E5, 1975, pp. 154–159, Es'Kov et al.

Primary Examiner—Harvey E. Behrend
Attorney, Agent, or Firm—Oblon, Spivak, McClelland, Maier & Neustadt

[57] ABSTRACT

A method and apparatus for generating and utilizing a compound plasma configuration is disclosed. The plasma configuration includes a central toroidal plasma with electrical currents surrounded by a generally ellipsoidal mantle of ionized particles or electrically conducting matter. The preferred methods of forming this compound plasma configuration include the steps of forming a helical ionized path in a gaseous medium and simultaneously discharging a high potential through the ionized path to produce a helical or heliform current which collapses on itself to produce a toroidal current, or generating a toroidal plasmoid, supplying magnetic energy to the plasmoid, and applying fluid pressure external to the plasmoid. The apparatus of the present invention includes a pressure chamber wherein the compound plasma configuration can be isolated or compressed by fluid or other forms of mechanical or magnetic pressure. A multiple chamber reactor device is also disclosed, as are methods and using apparatuses for rising the compound plasma configuration in a number of diverse situations.

34 Claims, 13 Drawing Sheets

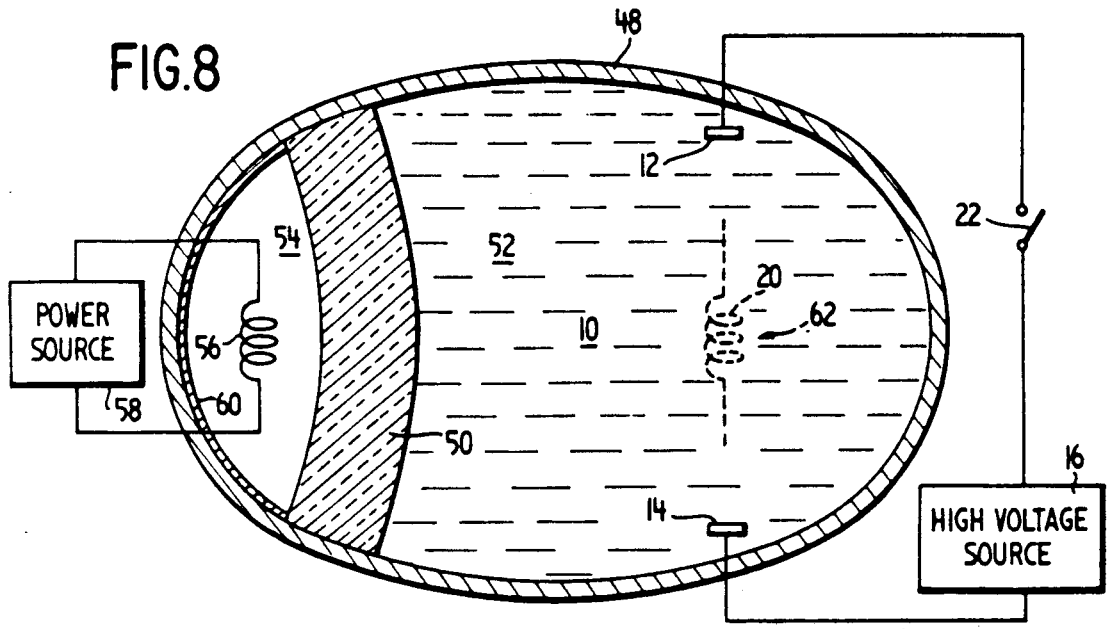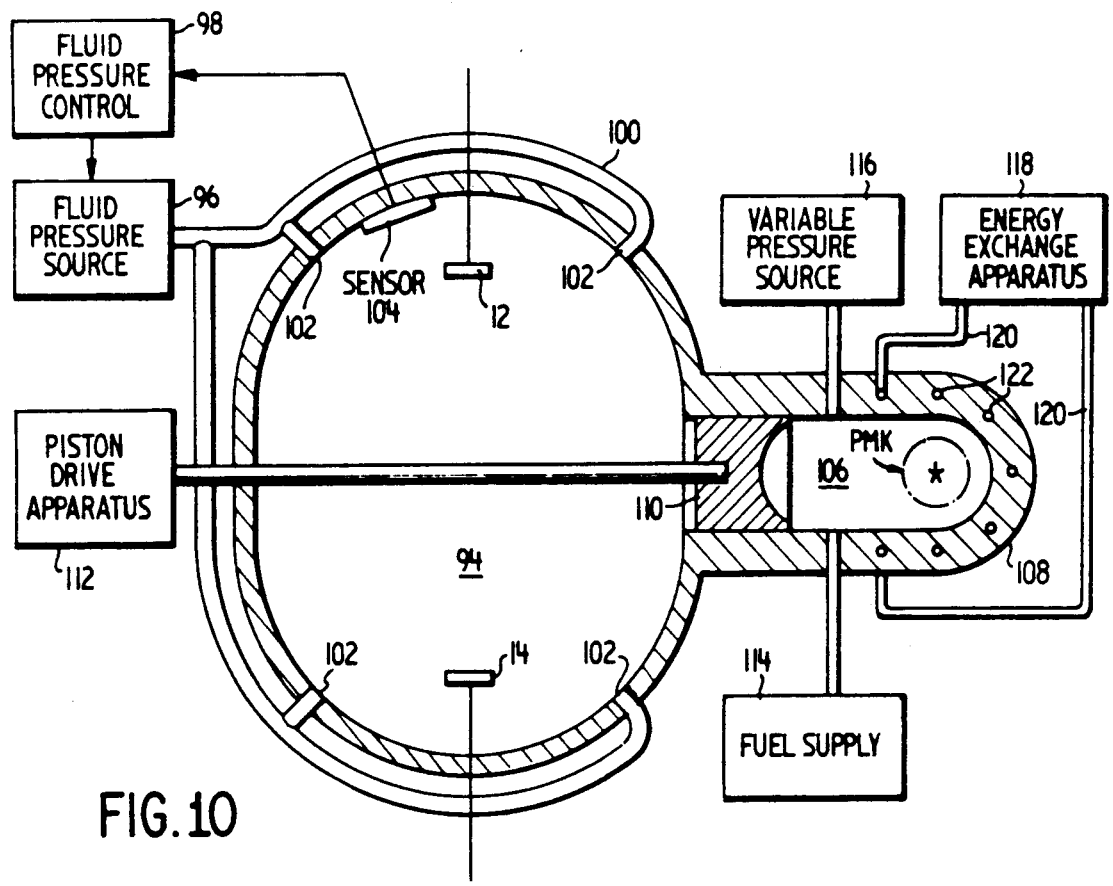

METHOD AND APPARATUS FOR GENERATING AND UTILIZING A COMPOUND PLASMA CONFIGURATION

RELATED APPLICATIONS

The present Application is a continuation-in-part of application Ser. No. 312,902, filed Oct. 19, 1981, now abandoned, which is a continuation of application Ser. No. 913,108, filed June 6, 1978, now abandoned, which is a continuation-in-part of application Ser. No. 902,839 filed May 4, 1978, now abandoned, which is a continuation of application Ser. No. 706,454, now abandoned, filed July 19, 1976, which is a division of application Ser. No. 409,060, filed Oct. 24, 1973 and now U.S. Pat. No. 4,023,065.

BACKGROUND OF THE INVENTION

1. Field of the Invention:

This invention relates generally to a method and apparatus for forming, manipulating and utilizing matter in the plasma state, and more particularly to a method and apparatus for forming, manipulating and utilizing a compound plasma configuration including a toroidal central plasma with electrical current surrounded by a generally ellipsoidal mantle of conducting matter or ionized particles.

2. Description of the Prior Art:

Since the present invention is in the field of high energy plasma physics and is intended to provide a step forward in the search for techniques to maintain controlled thermonuclear reactions, it is believed that a brief discussion of recent developments in the thermonuclear reactor field would be appropriate.

In essence, to achieve nuclear fusion it is necessary to heat a small quantity of fusion fuel above its ignition point, isolate the heated fuel charge from its surroundings long enough so that the release of fusion energy exceeds the input of heat energy, and finally convert the energy released into a useful form. The well known problem that is encountered in attempting to achieve nuclear fusion resides in the fact that relative kinetic energies of 10 KeV or more are required to cause fuel particles to fuse. This energy translates to a 100 million degree kinetic temperature, creating a need for magnetic confinement of the fusion plasma.

The problem that has prevented satisfactory containment of plasmas by magnetic fields is usually related to the inherent instability of the plasma confined in most field configurations and the end losses created by field discontinuities. As a result of the instability and end loss problems, devices existing in the past have been unable to attain a sufficiently high n*tau product to attain fusion. According to the Lawson criterion, the n*tau product must be greater than $10^{14}$ sec per $cm^3$, implying confinement times of between approximately 0.1 and 1.0 seconds for steady-state reactors. Another view points out that adequate confinement has not been achieved due to the technical limitations related to production of sufficiently high and sustained pressures. The most advanced prior art devices, such as the Tokamak, have been able to attain relatively long confinement times but without adequate pressure to produce the particle densities required at the appropriate temperatures to meet the Lawson criterion. Although laser or "micro-implosion" devices have produced high pressures, the latter are not sustained; consequently, these devices also have failed to achieve time density products anywhere near that required by the Lawson criterion. More extensive analyses of prior art devices and related physics or engineering may be found in the following articles:

Artsimovich, L. A. Tokamak Devices. *Nuclear Fusion,* 12, 215 (1972).

Bishop, A. *Project Sherwood: U.S. Program in Controlled Fusion.* Reading, Mass.: Addison Wesley Publishing Company, 1958.

Cobine, J. D. *Gaseous Conductors: Theory and Engineering Applications.* New York: Dover, 1941, 1958.

Furth, H. P. Tokamak Research. *Nuclear Fusion* 15, 487 (1975).

Furth, H. P. and S. Yoshikawa. Adiabatic Compression of Tokamak Discharges. *Phys of Fluids,* 13 2593 (1970).

Glasstone, S. and R. Lovberg. *Controlled Thermonuclear Reactions, an Introduction to Theory and Experiment.* Princeton, N.J.: D. Van Nostrand Co., 1960.

Gough, W. C. and B. J. Eastlund. The Prospects of Fusion Power. *Scientific American,* 224, No. 2, 50 (1971).

Kittel, C. *Introduction to Solid State Physics.* New York: John Wiley, 1971.

Malmberg, J. H. The Pure Electron Plasma, Liquid, and Crystal. *Bulletin of the American Physical Society,* 22, 9, 1200 (1977).

Post, R. F. Prospects for Fusion Power. *Physics Today,* 26, Apr., 30 (1973).

Shafranov, V. D. On Magnetohydrodynamical Equilibrium Configurations. *J. Exptl. Theoret. Phys.,* 33, 710 (1957). Translated in *Soviet Physics--JETP,* 6, 545 (1958).

Tuck, J. L. L'Energie de Fusion. *La Recherche,* 3, Oct., 857 (1972).

In view of the failure of previously existing systems and techniques to achieve satisfactory confinement of fuel plasmas, and in view of the fact that previous devices have generally consisted of minor variations on a few basic techniques of plasma confinement, it is believed that a need exists for a novel approach to the problems posed by nuclear fusion, and in particular it is believed that a need exists for utilization of a novel plasma configuration. In addition, a brief comparison between this novel plasma configuration and the currently best established approach, a Russian invention the Tokamak, is now made.

The similarity between the magnetic topology of the ATC Tokamak of Princeton's Plasma Physics Laboratory and that of this novel configuration is quite remarkable. Both devices produce a plasma ring with toroidal currents confined by a vertical field. The instant invention also contains poloidal currents in the plasma ring while the Tokamak's poloidal currents are generated in large field coils surrounding a toroidal vacuum chamber. The vacuum chamber wall of the instant invention is a simply connected region and more spherical or ellipsoidal in shape. Hence the name SPHEROMAK was coined by H. P. Furth of Princeton.

The maximum plasma pressure obtainable is on the order of one thousand atmospheres for Tokamaks since they are limited by the stresses on the poloidal field coils. Through pressure leverage the apparatus of the instant invention can achieve a sufficiently sustained pressure on the order of one million atmospheres without exceeding the technological limitations of its confining pressure chamber; consequently its pulsed fusion power density output can exceed that of a Tokamak by over one million times. The compression scaling laws are essentially the same as for the ATC Tokamak (Furth and Yoshikawa, 1970). Unfortunately, tokamaks can be adiabatically compression heated only by a token amount because of the interference of the inner toroidal vacuum wall and large poloidal windings. On the other hand, the method and apparatus of the instant invention can be fully compression heated to the fusion regime after an initial modest ohmic heating warmup period. In its best mode of practice this novel configuration consists of an all Plasma Mantle and Kernel (PLASMAK).

SUMMARY OF THE INVENTION

Accordingly, one object of this invention is the provision of novel methods for producing a unique compound plasma configuration.

Another object of this invention is the provision of novel apparatuses for producing a unique compound plasma configuration.

Yet another object of this invention is the provision of novel methods for manipulating and utilizing a unique compound plasma configuration.

Another object of this invention is the provision of novel apparatuses for manipulating and utilizing a unique compound plasma configuration.

Briefly, these and other objects of the invention are achieved by discharging a high energy voltage through a fuel atmosphere ionized in a helical path to form a helical current path. This helical current subsequently develops into a toroidal current forming the kernel of a compound plasma configuration. In addition to ohmic heating by currents induced by the kernel fields, the high temperature of the plasma kernel ionizes the surrounding atmosphere to develop a mantle of charged particles surrounding the plasma kernel which is susceptible to compression by mechanical forces. The apparatus for carrying out these steps also includes a system for applying fluid pressure to the resulting compound plasma configuration for the purpose of compressing the plasma mechanically. Alternative methods and apparatuses are also disclosed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a schematic representation of a first embodiment of an apparatus for performing the method of the present invention;

FIG. 10 is a schematic illustration of a third embodiment of an apparatus for performing the method of the present invention;

DESCRIPTION OF THE PREFERRED EMBODIMENTS

To facilitate understanding of the present invention, the following definitions of terminology used in this application are provided:

a. The kernel consists of plasma torus, poloidal and toroidal currents, and the corresponding toroidal and poloidal magnetic fields.

b. The plasma-mantle-kernel configuration of the invention is abbreviated PMK or PLASMAK.

c. The mantle is a conductor of matter or a plasma capable of trapping and compressing the external magnetic fields of the kernel or heliform plasma. The mantle may be the physical interface between the matter in which the PMK is embedded and the kernel fields.

d. The kernel plasma and mantle are spacially separated by a vacuous region and usually differ in temperature.

e. The mantle surrounds and encloses the kernel external magnetic fields substantially without gaps.

f. The compound plasma connotes at least two nested more or less spacially separated and distinct plasma or conducting bodies such as are found in the plasma mantle kernel configuration which interact through electromagnetic or magnetic fields impinging on each body.

Figure 1:
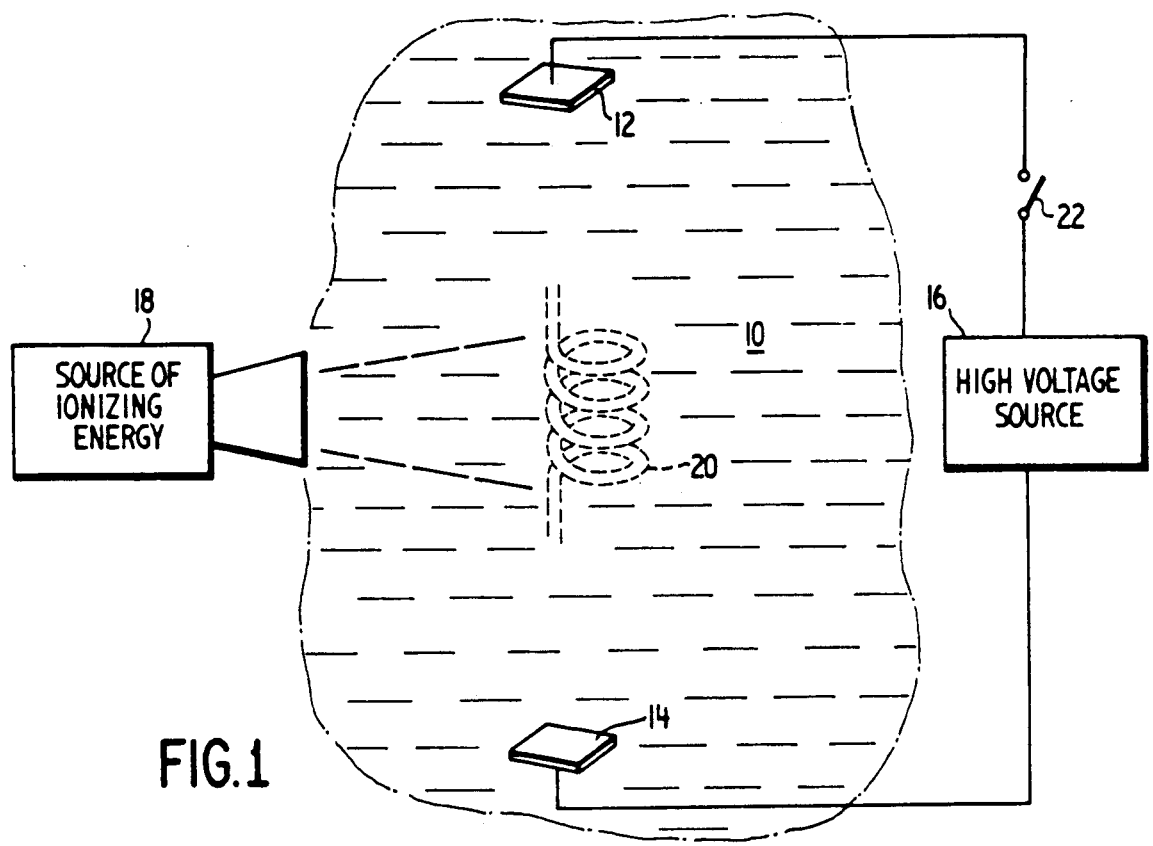
FIG. 1 is a schematic diagram of a first step in the method of the present invention showing the general ionization of an atmosphere and especially in a helical path.
Figure 2:
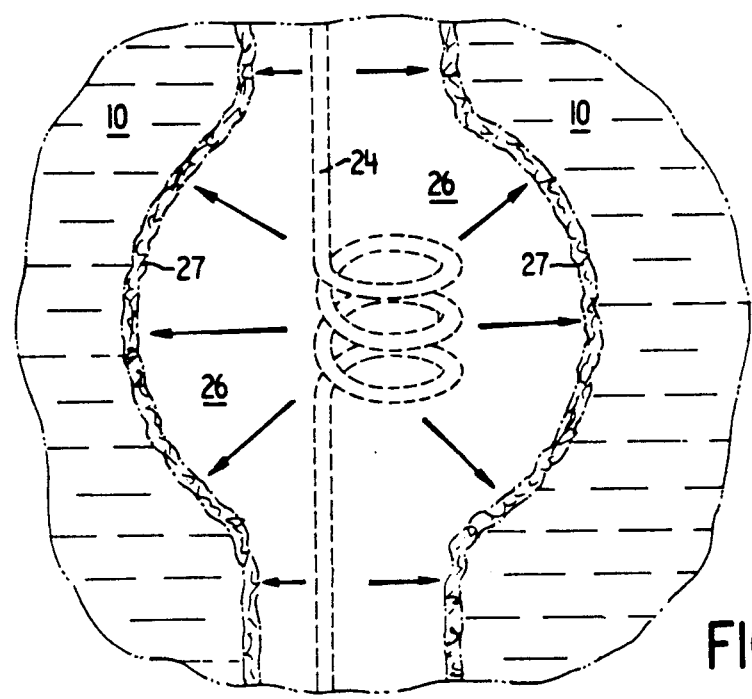
FIG. 2 is an illustration of a second step in the method of the present invention showing the current discharge and associated plasma magnetic forces in the vacuum region along the ionized path of FIG. 1.

Referring now to the drawings, wherein like reference numerals designate identical or corresponding parts throughout the several views, and more particularly to FIG. 1 thereof, a first step in the method of the present invention is schematically illustrated. An atmosphere of gaseous deuterium 10, or some equivalent medium suitable for producing a high energy plasma, is created in a region between a pair of high voltage electrodes 12 and 14. The electrodes 12 and 14 are coupled to a suitable high voltage source 16. A source of ionizing energy is oriented to project or focus energy into an area of, for example, the deuterium atmosphere 10 in the region between the electrodes 12 and 14. The projected energy is preferably formed or focused into a substantially helical path so that a generally helical region of greater ionization 20 is formed between the electrodes 12 and 14. When the high voltage potential generated by the source 16 is applied across electrodes 12 and 14 by closure of a switch 22, the high voltage potential difference between the two electrodes will result in a discharge through the atmosphere 10 following the ionized path 20. The result will be the formation of a helical current stroke 24 as illustrated in FIG. 2. The extremely fast rise time of the powerful current stroke 24 resulting from the large magnitude of the potential difference between the electrodes 12 and 14 causes a sufficiently rapid buildup of magnetic energy so as to induce energetic image currents externally and to explosively displace the conducting matter or ionized gas surrounding the channel. This force results in the creation of a low pressure or substantially evacuated region 26 surrounding the helical current stroke 24. Similarly, the high power and high temperature radiation of the current stroke 24 also aid in the formation and maintenance of an ionized boundary layer or sheath 27 which forms an interface between the atmosphere 10 and the semi-evacuated region 26. In addition the shock expansion of the ionized gas due to the high rise time current storke 24 produces an intensification of ionization at the magnetic and ionized gas boundary or sheath 27.

Figure 3:
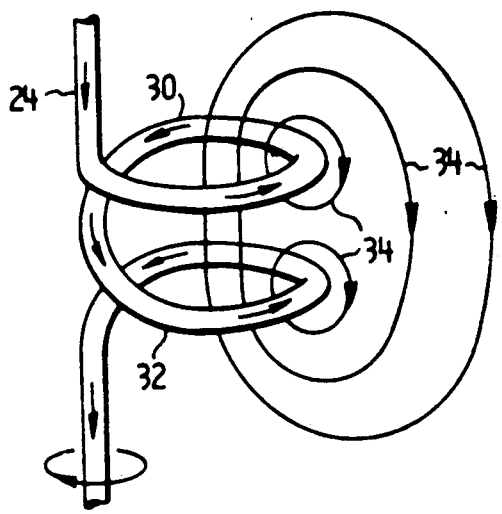
FIG. 3 is a schematic diagram illustrating the magnetic field coupling of adjacent turns produced by the discharge illustrated in FIG. 2.

The helical path followed by the current stroke 24 is important because of its magnetic properties. Although the discharge path may consist of a single loop the current stroke 24 usually includes a plurality of loops as shown in greater detail in FIG. 3, two of which are illustrated at 30 and 32. Each of these current loops produces a magnetic field represented in FIG. 3 by lines of flux 34. The magnetic fields produced by the various current loops couple together, drawing the current loops together into a single toroidal plasma loop 36, illustrated in FIG. 4. The toroidal plasma loop 36 becomes the plasma kernel of the compound plasma structure formed according to the present invention. The plasma current 37 also produces a poloidal magnetic field around it, as illustrated by the flux lines 34.

Figure 5:
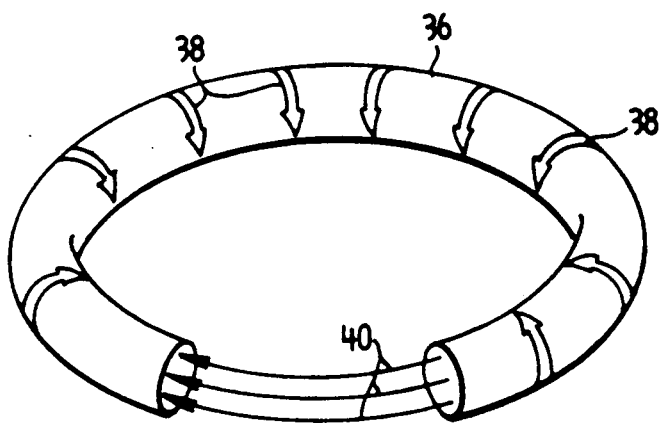
FIG. 5 is a schematic diagram of the internal toroidal magnetic field and poloidal surface currents produced in a plasma torus.

FIG. 5 illustrates in greater detail the dynamic energy configuration of the plasma kernel 36, showing in particular a circular surface current 38 which circulates about the minor axis of the toroidal kernel. The surface current 38 results in a toroidal magnetic field within the heart of the kernel 36, represented by the flux lines 40. The production of this surface current occurs in much the same manner as the production of toroidal current described above. To realize this, consider the collapse of a compound helical plasma current path. Such helical shapes are found in certain light bulb filaments, for example. These secondary helical surface currents (not shown) upon the surface of the primary helical current stroke 30 and 32 result as it collapses into the closed ring 36. Certain naturally occurring plasma instabilities can enhance these currents. There are many well known and obvious techniques practiced by those skilled in the art of experimental plasma physics for exciting such currents within current strokes. The discussion of FIG. 11 below describes yet another novel technique for introducing controlled poloidal surface currents which has other advantages.

Figure 6:
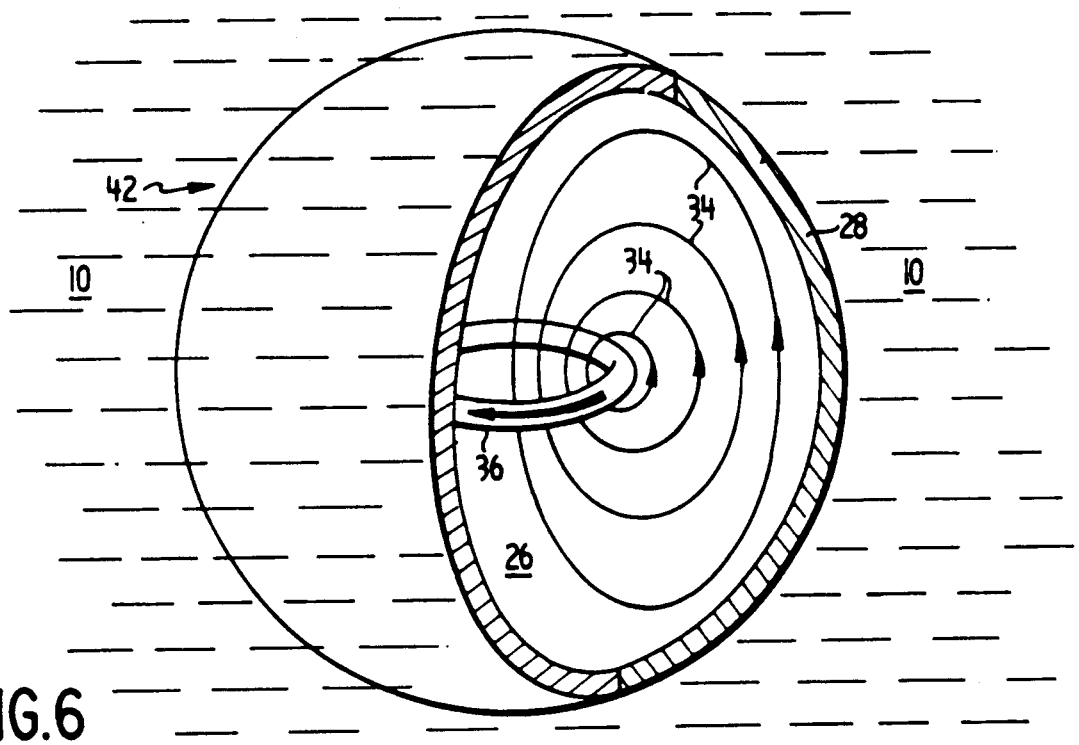
FIG. 6 is an illustration of a compound plasma configuration or Plasma Mantle-Kernel configuration (PMK) illustrating the constrained internal poloidal magnetic field of the PMK.

Referring again to FIG. 2, it will be recalled that an ionized layer or sheath 27 is formed around the current stroke 24, before it collapses into the toroidal kernel 36. As the toroidal kernel 36 is formed, the portions of the current stroke on either side of the helical or looped portion dissipate rapidly, as do the sheath portions associated with these non-looped portions of the current stroke. As a result, the sheath 27 tends to collapse into a generally ellipsoidal shape of conducting matter or mantle 28 surrounding the compound plasma configuration as shown in FIG. 6. This will be designated the plasma-mantle-kernel configuration, or PMK 42. This configuration is a substantially stable one in that the high current of the hot kernel 36 exists in a near vacuum and thus does not dissipate rapidly. The kernel current also produces a strong poloidal field, represented by the flux lines 34, supporting the ionized particles in the mantle 28, thereby preventing the mantle from collapsing into the low pressure, low density region within. The mantle 28 is prevented from expansion, however, because the pressure of the internal poloidal field reaches equilibrium with the fluid pressure of the external medium. The decaying magnetic field energy provides an EMF which tends to maintain the energetic currents of both the kernel and the mantle. Alternatively, the mantle may be composed of any other sufficiently electrically conducting mediums which can be used to trap the kernel fields and could be utilized to compress the fields of the kernel.

Figure 4:
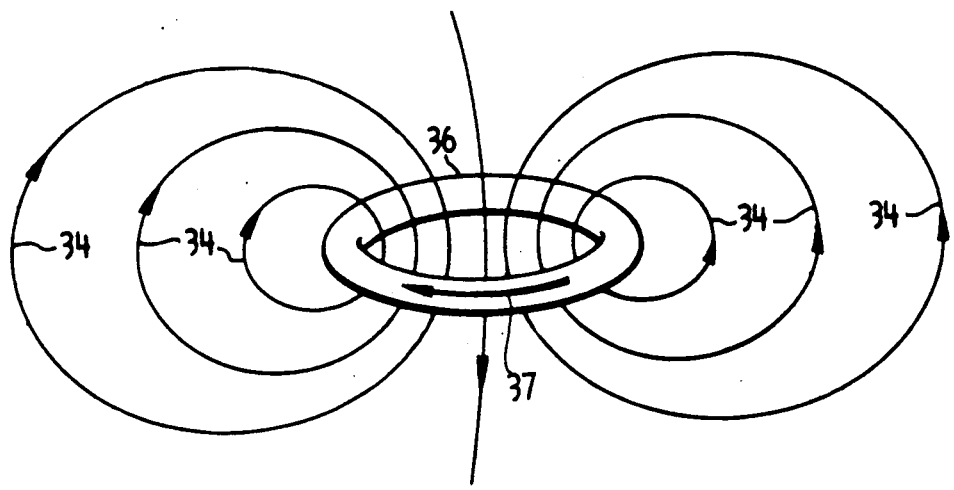
FIG. 4 is a schematic diagram illustrating a toroidal current and its associated unconstrained poloidal magnetic field.
Figure 7:
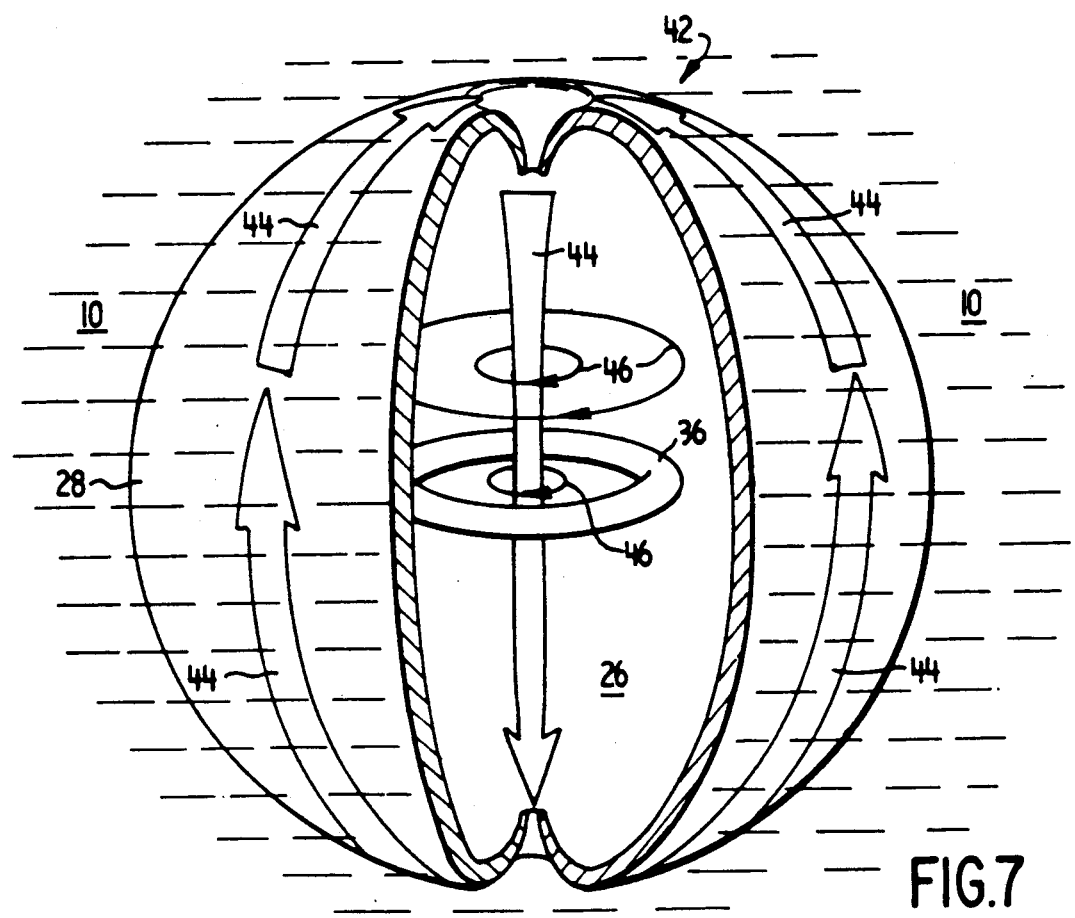
FIG. 7 is a partially cut-away schematic diagram of a possible variation of the PMK of FIG. 6 illustrating the poloidal currents within the mantle and the internal toroidal magnetic field produced by said currents.

FIG. 7 illustrates a poloidal current 44 that may be present which circulates around the mantle 28 and threads through the center of the toroidal kernel 36, following the flux lines of the poloidal field generated by the kernel 36. The poloidal current 44 results in the formation of a toroidal field within the low pressure region 26, as illustrated by flux lines 46. However, the sum of the toroidal and poloidal fields shown in FIGS. 6 and 7 respectively is not shown. Similarly the mixture of the poloidal and toroidal fields of the kernel shown separately in FIGS. 4 and 5 are not shown. Mixing of the overlapping poloidal and toroidal fields is important and is related to the parameter known as the Kruskal-Shafranov limit and itself gives rise to the effect conventionally known as shear stabilization. The long-term stability of this configuration is aided by the fact that the ratio of poloidal and toroidal current components changes in time within certain limits. This is due to the different respective components of toroidal and poloidal conductivities and magnetic energies which decay in value at different rates. This is conventionally known as dynamic stabilization.

The poloidal currents 44 flowing on the surface of the mantle 28 may in some cases be formed automatically by perturbations in the fields produced by the initial formation of the PMK. On the other hand, such currents can be induced by triggering a second current stroke threading through the open center of the toroidal kernel 36. The poloidal currents 44, which generate the internal toroidal field 46, also tend to stabilize the PMK configuration. Clearly such a secondary current stroke can also enhance the poloidal surface currents of the kernel. Once produced these currents generally tend to relax to a force free state.

The initial energy used to form the helical ionized path may take any number of sources or combination of sources. X-ray energy can be used, as can electron or ion beams. Furthermore, conventional corona discharge equipment can be used, as can laser energy. An extremely powerful flashlamp and an optical focusing system can also be used to produce the helical ionized path. Other techniques for forming the helical ionized path includes a pre-formed wire of $Li^6$ or $LiH^2$ which can be plasmatized by the application of a pre-pulsed current. A twisted tornado-like gas vortex with a heliform rarefaction channel can also be used, as can certain instabilities of linear discharges which cause heliform channels. Naturally, numerous additional techniques are within the realm of those skilled in the art for forming the ionized helical path.

The viscosity and pressure of the external fluid surrounding the mantle of the PMK also provides a damping and volume constraining influence on any expansion or contraction of the kernel through magnetic coupling, thereby further tending to stabilize the PMK configuration. The low particle pressure or nearly evacuated region 26 and the high magnetic pressure near the torus within the PMK substantially prevents the kernel currents 37 and 38 from losing conductivity due to diffusion of particles. That is to say that the kernel plasma 36 sits in a shallow potential well of its fields (i.e., 34) and this is conventionally known as minimum average B stabilization. As a result the kernel current may exist for a substantial period of time during which its primary energy loss is through high temperature radiation to the mantle 28. Naturally, the duration or life of the kernel current, and of the resulting PMK, varies greatly depending upon the magnetic energy and temperatures of the PMK particles and currents, the pressure of the surrounding gaseous atmosphere, the impurities present, and the quality of the vacuum in the low pressure region 26 and plasma instabilities.

From the foregoing, it should be apparent that the PMK plasma configuration does not have to depend on any external magnetic or electric field for its existence. Rather, it is similar to a charged battery in that it is able to store or retain energy for a relatively significant period of time, depending upon the temperature, surrounding fluid pressure, and its initial energy content. However, further energy can be supplied to the PMK by compressing it mechanically with fluid pressure. In this regard it is noted that the charged particles forming the ionized mantle 28 generally will not penetrate the intensive poloidal field generated by the circulating current flowing within the kernel 36. Thus physical fluid pressure can be exerted on the mantle 28 for compressing the mantle. However compression of the mantle will act with a "lever-and-fulcrum" effect to force compression of the poloidal field, indicated by flux lines 34, and will result in increasing the energy and temperature of the kernel. Accordingly, the internal temperature and energy of the PMK can be increased by applying mechanical fluid pressure to the exterior surfaces of the mantle 28. Considering the smaller surface area immediately enclosing the kernel plasma in comparison to the surface area of the mantle, the external compressive force results in a higher applied pressure upon the kernel through the intervening dipole magnetic field. Correspondingly, it is noted that if a gas or liquid is used to apply fluid pressure to the mantle, particles will, of course, tend to diffuse through and penetrate the mantle. However these particles will become ionized as they are exposed to energetic electron currents of the mantle and the intense short wavelength photons or neutrons radiated by the kernel 36; thus will, in effect, become portions of the mantle 28, and will be unable to penetrate the magnetic field within the PMK in large quantities. Thus the inherent internal energy of the PMK will prevent the surrounding fluid medium from penetrating into the low particle pressure region 26, so that this region will maintain its near vacuum condition.

Energy can also be supplied to the PMK by external electrical, magnetic and electromagnetic fields, as will be apparent to those skilled in the art. Furthermore, external magnetic and electric fields can be used to physically manipulate the PMK. Similarly, external fluid pressure and even mechanical devices can be used to move or manipulate the PMK, since it behaves to some extent in the same manner as a semi rigid physical body in the sense of an ordinary soap bubble. Movement of the PMK by mechanical tools, such as a metal piston, for example, is possible because of the image currents induced in the metal piston by radiations and stray fields of the PMK which result in repulsion of the PMK body.

An apparatus for forming the PMK according to the method described hereinabove is illustrated schematically in FIG. 8. As shown, a structural shell 48 of generally oval cross section has the two electrodes 12 and 14, described above, mounted within its enclosed volume. A transparent partition 50, which may be constructed of quartz for example, may be used to separate the structural shell 48 into a PMK triggering or formation chamber 52 and an ionization energy chamber 54. A high intensity helical flashlamp filament 56, which is coupled to a suitable power source 58, is shown mounted in the ionization energy chamber 54. It will be appreciated by those skilled in the art that the high intensity flashlamp 56 is merely representative of one of the various types of excitation and ionization energy sources which can be substituted for it. Similarly, the transparent partition 50, if one is used, is understood to be transparent to the type of energy generated by the energy source selected for use in the ionization energy chamber 54. A suitable reflecting surface 60 is formed or coated on an inner surface of the ionization energy chamber 54 to provide a means of focusing the energy created by the high intensity flashlamp filament 56 (or any suitable energy source) at a focal point or region 62 in the ignition chamber 52. Alternatively, the partition 50 may be designed as a lens (not shown) or correction plate to focus the ionization or excitation energy. The intense light radiation generated by ignition of the flashlamp filament produces the desired helical and slightly ionized path in the atmosphere or medium 10 of the ionization chamber 52. Thus by closing the switch 22 at precisely the moment when the helical semi-ionized path 20 is fully formed at the focal image or region 62, a helical current stroke 24 of the type illustrated in FIG. 2 is produced, resulting in the formation of a PMK as described above. The surge voltage induces the formation of an anode streamer which itself is seduced into a helical form by the slightly pre-ionized region 62.

It is well known that certain excitation or ionization beams impinging upon gas molecules can alter the absorption coefficients of these molecules to certain electromagnetic frequencies or frequency bands. By projecting a beam producing such excitations along the inter-electrode axis, the gas within the beam can be made to be more absorbing to the light energy emanating from the flashlamp. Setting the beam diameter to being just slightly larger than the image of the flashlamp can enhance the efficacy of this system.

The starting pressure of the atmosphere 10 within the structural shell 48 is preferably in the range from 0.5 to 5.0 atmospheres. Much lower pressures diminish the PMK energy density and lead to excessive scattering of energetic currents in the mantle due to larger particle density fluctuations. Much higher initial formation pressures may demand excessive voltages.

The PMK plasma configuration can be formed with widely varying initial energies and in a wide range of sizes. For a torus pressure of 870 atmospheres and a mantle pressure of one atmosphere one would find the following approximate PMK mantle diameters, total magnetic energies, currents and toroidal diameters respectively:

| Mantle diameter (cm) | 7 | 27 | 60 | 100 |
|---|---|---|---|---|
| Energy (kiloJoules) | 1.3 | 90 | 1000 | 6000 |
| Current (Mega Amperes) | .26 | 1 | 2.4 | 4 |
| Torus diameter (cm) | 4 | 6.5 | 9 | 13 |

One of the chief features of the plasma configuration of the present invention is the ability to compress the kernel plasmas to heretofore unimaginable pressures by the application of moderate mechanical pressures to the mantle. This is due to the fact that fields outside a magnetic dipole decrease as the inverse cube of its radial distance. This means the energy density or pressure falls off by the inverse sixth power. This law does not hold for small distances, but for our purposes the energy distribution would be $(1/r^{3-\epsilon})^2$ where $\epsilon < 1$ and depends upon the ratio of the mantle radius b to the major ring radius R. Thus the present invention provides a unique lever and fulcrum type compressive effect.

One key factor which must generally be observed in forming the PMK, however, is a fast current rise time in order to create the evacuated region 26. Given this current rise time the voltage or energy input required to produce the PMK will be determined primarily by characteristics such as the effective circuit impedance and the magnitude of the surge voltage: During the current stroke, physical characteristics such as the pressure of the atmosphere 10, the resistance of the atmosphere, and the inductance of the discharge channel change rapidly in value over orders of magnitude at the discharge channel due to the effects of the surge voltage, streamer formation, conductivity of induced energetic electron currents, reflected electromagnetic force, and "snow plowing" effects of the magnetic field, etc. Accordingly a small PMK having a diameter on the order of ten centimeters may be formed in a small triggering chamber of 2 meters in diameter with a total energy input of tens of kilojoules.

The initial energy for generating the PMK may be obtained from conventional high voltage sources utilized with Blumlien lines and the like and appropriate high pressure switches. These energy sources include D.C. charged capacitor banks, Marx generators, or Van de Graffs of the type now used in lightning simulating machines and various types of fusion research devices.

The exact temperature of the kernel naturally depends upon ohmic heating, the magnetic energy of the PMK, the particle density and atomic number, magnetic pressure and many other factors. The mantle temperature similarly varies depending upon the precise conditions under which the PMK is formed. However, the mantle temperature always remains significantly below the kernel temperature. The kernel temperature for a large compressed PMK will surpass the temperature required for nuclear fusion and the cooler mantle will act as a radiation and magnetic shield between the kernel and the chamber walls.

Figure 9:
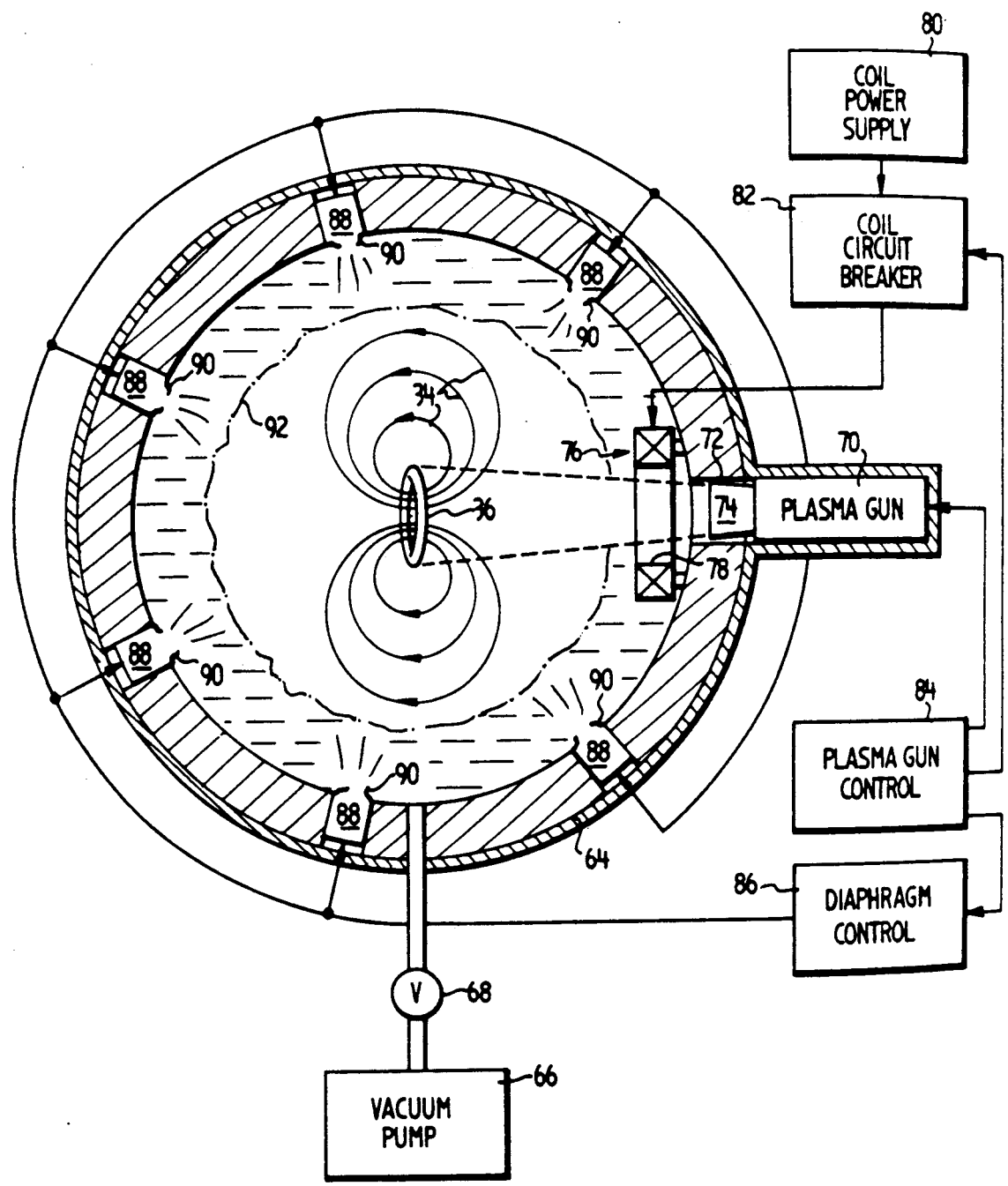
FIG. 9 is a schematic illustration of a second embodiment of an apparatus for performing the method of the present invention.

A second method and apparatus for producing the PMK configuration is illustrated in FIG. 9. In the FIG. 9 embodiment, a pressure vessel 64 is shown which may be equivalent to the triggering chamber 52 of FIG. 8. The configuration, structural material and pressure withstanding capability of the pressure vessel 64 are dictated by the size and energy of the PMK to be produced, as will be apparent to those skilled in the art. A vacuum pump 66 is coupled through a suitable pressure valve 68 to the interior of pressure vessel 64 for the purpose of evacuating it. A conventional plasma or plasmoid generating gun 70 is mounted in a suitable aperture 72 in the wall of the pressure vessel 64. As is well known to those skilled in the art, a particle beam gun, a Marshall gun, punch coil or plasma gun 70 are all capable of generating and projecting plasmoids of any suitable configuration into the interior of pressure vessel 64. In the apparatus of the present invention, the plasma generating gun 70 is preferably selected to generate toroidal plasmoids, as illustrated schematically at 74. A high energy coil or air core inductor 76 of generally cylindrical symmetry is mounted to the walls of the pressure vessel 64, and is oriented such that its central aperture 78 is aligned with the plasma gun 70, so that the toroidal plasmoid 74 generated by the plasma gun 70 will pass through the central aperture of the coil 76. A high energy power supply 80 is coupled through a suitable circuit breaker 82 to the high energy coil 76 for energizing the coil. The coil power supply 80 is preferably a conventional high-power supply of the type used for producing intense magnetic fields in known nuclear fusion research machines. This coil (or it may be a plurality of coils) is so constructed as to produce poloidal and toroidal magnetic fields to excite the appropriate current modes in the kernel as described previously in the other preferred method. Enhancement of the poloidal currents by the method of FIG. 7 applies. A plasma gun control 84 is coupled to the plasma gun 70 for initiating the generation of a plasmoid and its expulsion into the pressure vessel 64. The plasma gun control is also coupled to the coil circuit breaker 82 and to a diaphragm control 86 for actuating both of these devices. The diaphragm control 86 is in turn coupled to a plurality of gas pressure sources 88 located symmetrically around the inner surface of the pressure vessel 64. Each of the gas pressure sources is initially sealed by a frangible diaphragm 90. The gas pressure sources 88 may be cylinders or containers of compressed gas sealed by a diaphragm which is explosively destroyed in response to receipt of an electrical ignition signal from the diaphragm control 86. Alternatively, the gas pressure sources may simply include quantities of a suitable gas packaged in an explosive housing which is ignited by a signal from the diaphragm control 86. Naturally, numerous equivalent types of conventional fluid pressure sources can be used in lieu of the specific structures described.

In operation, the pressure vessel 64 is initially evacuated by the vacuum pump 66. The high energy coil 76 is then energized by the coil power supply 80 so that an intensive magnetic field is built up in the vicinity of the coil 76, and in particular in the region of the central aperture 78. The plasma gun control 84 is then triggered to cause a toroidal plasmoid 74 to be generated and projected through the central aperture 78 of the high energy coil 76. Alternatively, the high energy coil can be mounted inside the pressure vessel 64 opposite the plasma gun 70. The toroidal plasmoid would then be projected toward the central aperture of the coil and currents switched appropriately so as to be reflected therefrom with an absorption of energy. The plasma gun control 84 is coupled to the coil circuit breaker 82 to provide a timed circuit breaker signal so that the coil circuit breaker or magnetically activated fuse or the like is opened at precisely the instant during which the toroidal plasmoid 74 passes through or near the central aperture 78. Alternatively, the ionization of the toroidal plasma may be induced or enhanced by electromagnetic or particle beam means such as those suggested for purposes of ionization of the channel in the method of FIG. 8 whereby projected ionizing energy forms a toroidal plasmoid in the vicinity of aperture 78. It will, of course, be appreciated that the high energy coil 76 may actually be an air core inductor, and that the central aperture 78 may be the air core of the inductor. Alternatively, the inductor may contain a permeable core with a suitable air gap in the core material to allow for the kernel formation near the space of this gap. As the plasmoid 74 passes through the air core at the same instant that the coil power supply circuit is broken, a large transfer of magnetic energy from the collapsing field of the coil 76 to the plasmoid will take place. Thus the plasmoid 74 will emerge from the coil 76 with a greatly increased energy. As the plasmoid travels toward the center of the pressure vessel 64, a second appropriately timed signal from the plasma gun control 84 actuates the diaphragm control 86, causing the individual diaphragms 90 to be explosively fractured so that a resulting shock wave front 92 is produced by high pressure gas escaping from the gas pressure sources 88. This shock wave front 92 surrounds and is ionized by the E.M.F. produced by collision with the field and the radiations of the now highly energized toroidal plasmoid 74, which has become kernel 36 of the type previously described. The ionized wave front 92 then becomes equivalent to the previously described mantle 28. As a result a PMK is formed within the pressure vessel 64.

Various modifications of the apparatus illustrated in FIG. 9 are possible. For example, the coil 76 may be removed from the interior of the pressure vessel 64 once the PMK is formed, to prevent damage due to the intense heat within the vessel. Furthermore, the apparatus illustrated in FIG. 8 may be combined with that illustrated in FIG. 9 to the extent that the plasma gun 70 of FIG. 9 may be replaced by a high intensity flashlamp 56, or equivalent energy source, of the type described with reference to FIG. 8. Thus the PMK could be formed in the vessel of FIG. 9 according to the method described with reference to FIG. 8. The gas pressure apparatus of FIG. 9 would then be used for the purpose of compressing the PMK after it has already been formed to increase the energy concentration in the plasma kernel 36.

Alternatively the method of producing the poloidal current 44 on the mantle 28 can be applied independently of the production of the kernel 36. Utilizing techniques described in the discussion of FIG. 11 below, a mantle-like structure shown in FIGS. 6 and 7 can be generated with both poloidal 44 and toroidal (not shown) currents. This is accomplished by injecting a fast rise current stroke with an internal axial field through the gas region 10. Utilizing sufficient pressure in region 10 and by limiting the peak current and energy of a linear current stroke, the sheath 27 will not separate catastrophically from the stroke channel. Image currents will be induced in a sheath by the fast decay of stroke currents. These image currents will naturally close to produce the mantle-like structure shown in FIGS. 6 and 7 but without an internal vacuum region and kernel 36. This structure has the disadvantage of being embedded in the formation atmosphere and cannot be made with the compactness and energy density of a kernel produced by the preferred method. Consequently it may not have the necessary characteristics to be of interest in fusion applications.

Figure 11:
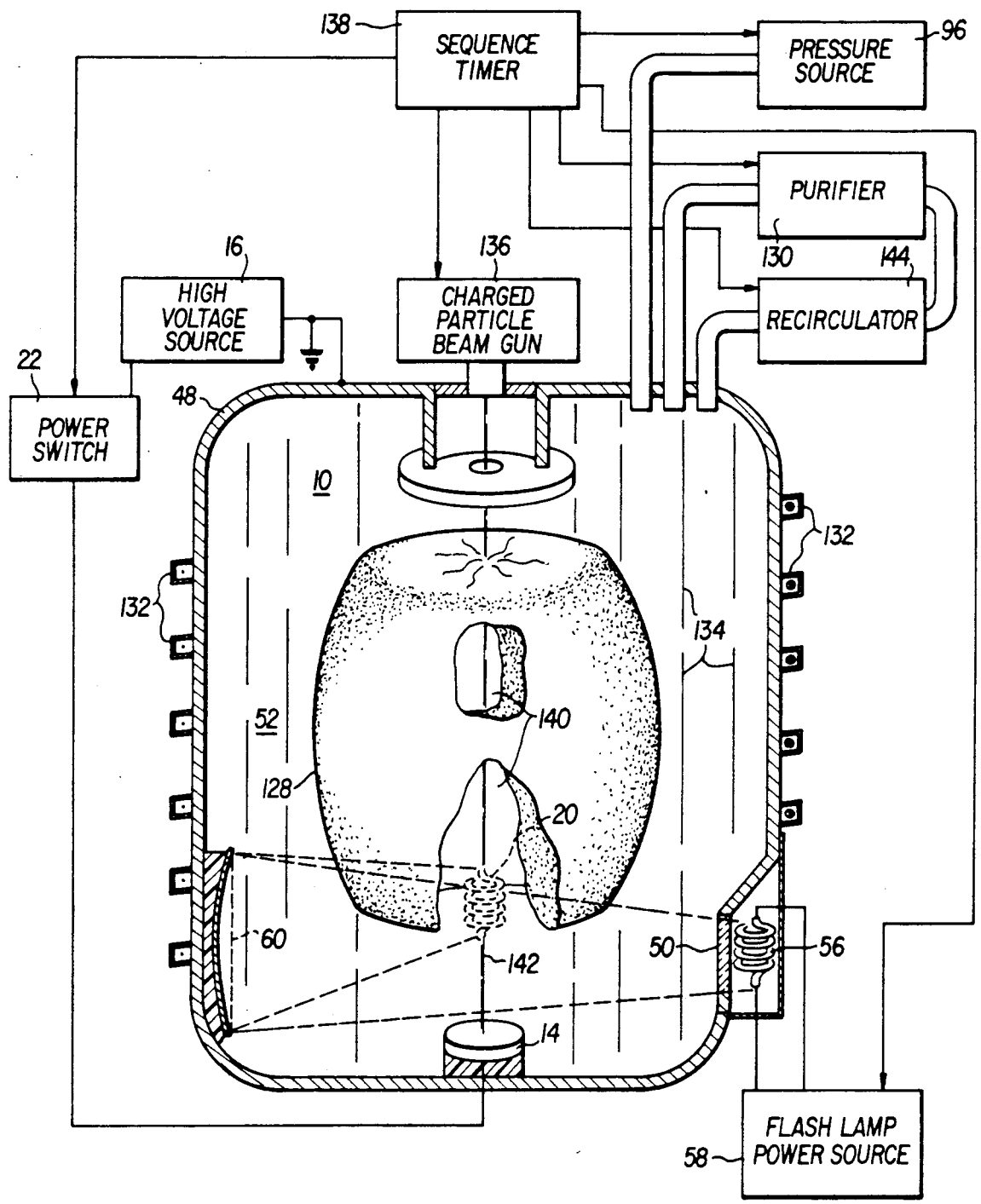
FIG. 11 is a schematic illustration giving more detail to the first step in the method of the present invention, especially showing the disposition of the charge cylinder or reservoir and magnetic vertical field, at the instant of the current stroke initialization.

FIG. 11 illustrates a method and apparatus which is beneficial in producing controlled toroidal fields (and associated poloidal currents) in the kernel plasma, providing a proximate charge reservoir 128 to promote fast current stroke rise times and also reduce the dependence upon electrode 12, thereby lessening contamination of region 10 or the resulting PMK by electrode material. This technique coupled with continuous circulation of the fuel atmosphere 10 through the chamber and a conventional filter system or purification device 130 can reduce PMK contamination to well below problem levels. A vertical field coil 132 produces a rather weak vertical magnetic field 134 within the formation region 52. A charged particle or electron beam gun 136 injects a quantity of charge (i.e. less than a few millicoulombs of electrons per meter) through an opening in electrode 12. A conventional sequence timer 138 regulates beam energy, gas density, and the intensity of other auxiliary electrical devices (i.e., pulsed magnetic fields, not shown) which can act together so as to effect a collection of charge in a region 140 between the electrodes. The sequence timer is coupled to power switch 22, a charged particle beam gun 136, a conventional pressure source 96, conventional purifier 130 and recirculator 144 and flash lamp power source 58. Due to self electric fields these charges naturally repel so that they move radially away from region 140 to form an ellipsoidal closed shell 128 encircling region 140 at some time after injection. This time interval depends naturally on quantity and current waveform of the injected charge as well as type of gas, gas density, etc.

The activated flashlamp 56 and mirror 60 act to seduce the anode streamer 142 or initial current stroke formation channel to obtain the helical region 20 as discussed above. For example, computer controlled regulation devices in sequence timer 138 can insure an appropriate assembly of energies, densities, voltages, firing times, and the like so that continuous production of viable and uniform PMKs will result.

For example, triggering of a flashlamp 56, electron beam gun 136, and current stroke 24 can occur separately. Flashlamp 56, electron gun 136, and high voltage source 16 or switch 22 can be sequentially fired so that the streamer 142 reaches ionized path 20 concurrently with the favorable positioning of the charge cloud 128.

The upward propagation speed for streamer 142 into region 140 is sufficient to produce a sudden and strong electric field wavefront to appear at the charge reservoir surface 128 or the surface of the surrounding charged chamber wall. Influenced by the electric field, the cloud of charged particles accelerates energetically to the anode streamer 142 where the particles turn abruptly and follow the streamer toward the electrode 14. At the points of intersection with the channel, the rise in azimuthal field is so intense at this turning point (defined to be the apex of the current stroke) that the intensifying azimuthal field acts as a sort of choke ring which funnels or gathers the radially streaming electrons into and down the channel. This is analogous to the use of a choke ring to lay parachute cords parallel during packing. So as the apex ascends, it continues to gather in the radially streaming electrons from the yet undischarged portions of the charge cylinder. And further, at the ascending apex of the streamer or current stroke, the sudden presence of the intensifying azimuthal field excites a strong image current in the adjacent gas. This image current forms a sheath upon or just outside the surface of the channel 24 of FIG. 2. As the currents rise, the resultant magnetic forces cause the sheath and channel to separate producing an evacuated region, as described in the discussion of FIG. 2.

This technique can be utilized to result in reflected voltages over several times the normal breakdown voltage of the gas. If the pulse time is shorter than the heating time for the gas, electron runaway can occur. Given sufficient voltage, the electron current flow will be relativistic.

Eventually, the energetic electrons in the primary channel flow through the helical segment which collapses and shorts to form a closed toroidal path. Thus energetic electron currents can be trapped within the kernel. Likewise, energetic currents are formed and subsequently trapped in the mantle except that the pulsed high potential field which generates them arises from a transformer EMF produced by the sudden generation of azimuthal currents arising from the primary channel.

Three interesting phenomena can be related to energetic or relativistic electron currents which can enhance the stability and lifetime of the PMK. First, the collapsing of the charge cloud 128 into the channel would proceed essentially collisionlessly and would compress the vertical field 134 ahead of it into the channel. It is this component of field which forms the kernel toroidal field. Second, the intensity of relativistic currents in the sheath channel easily maintains full ionization of a gas or plasma. Third, their conductivity is approximately $10^5$ times ordinary metal or plasma conductivities resulting in low ohmic damping and making feasible the production of megampere currents. The transformed voltage between the channel and initially formed sheath is essentially one to one. Consequently, the occurrence of predominately relativistic currents in the channel can be indicative of relativistic currents in the sheath. Notwithstanding the initial strongly ionizing effects of dense energetic currents, the dissipation of megampere currents in the resulting kernel and mantle can be relatively slight over a period of a second.

The inertia of the electron currents is found in their collective magnetic field and in their mass inertia. Weak currents of MeV electron beams have a very small component of magnetic inertia by comparison to the kernel currents of a PMK. It is noted that Astron type configurations operate with a much lower peak relativistic current and magnetic energy. Consequently, they have a lower ratio of magnetic to kinetic inertial energy. The PMK, on the other hand, has a very high ratio.

And so, once these strong energetic currents are present, their continued presence within mantle and kernel requires a maintenance voltage which is easily provided for quite some time by the decaying field. This results in an ample and useful lifetime in most applications.

It should be noted that the large surface area of the mantle combined with the low average dissipation of relativistic image currents results in its quite low temperatures. The electrified particles tend to remain embedded in the poloidal stray fields which in turn restricts the loss of energy by convection and diffusion of electric particles from the mantle into the surrounding fluid. Charge exchange also tends to conserve energy since the temperature difference between the mantle and immediately surrounding layer of gas or partially ionized gas is small. That is, the energy associated with ionization may be larger than the energy associated with the temperature difference between the mantle and the immediately surrounding region 158 of FIG. 12.

On the other hand a 120 cubic centimeter kernel plasma of hydrogen whose vacuum field isolates it from the mantle can be ohmically heated to over 500 eV by a megampere toroidal current of 25 keV electrons. A relativistic current of constant density displays higher conductivity in a cold fully ionized gas than in a hot fully ionized gas of the same particle density.

Of course, there are many other arrangements which can be made which accomplish the same effect. For example, the electron gun 136 can be replaced by a multiplicity of guns arranged in a number of geometries to project electrons into the region 140, or to project electrons so as to form the charge cloud 128 in the proximate position as shown in FIG. 11. Or alternately, a multiplicity of high pulse power beam guns could feed a current wave pulse of relativistic charge into the region 140 as the anode streamer 142 begins to form. This would in effect eliminate the need for the cloud 128 to be established and maintained as a charge reservoir. By directing these pulsed beams to enter the region 140 directed to only one clockwise side of the interelectrode axis, a net current vortex in the anode streamer would result. Thus an axial field is produced in the current stroke which gives rise to the kernel toroidal field 40 of FIG. 5 but without a need for the externally produced weak vertical field 134 and its field coil source 132. Of course, many other combinations of these techniques are effective including those techniques well known to those skilled in the art of producing current strokes with vorticity, such as the interaction of the current stroke 24 with a cusp field (not shown). And further, the application of intensive pulsed negative electric fields to the electrode 12 so as to produce a highly stressed voltage condition can result in copious field emission currents or coronas which have the effect of charging the region 140, as is well known to those skilled in the art of producing high voltages and electrical coronas.

Having described the general characteristics of the PMK and methods of generating it in the previous material, emphasis will now be directed to techniques which utilize the unique properties of the PMK to produce nuclear fusion. In particular, one of the most unique properties of the PMK is its capability of being compressed by a mechanical force such as fluid pressure. This characteristic permits the energy of the PMK to be increased dramatically simply by the use of conventional and inexpensive mechanical or chemical energy sources, such as conventional hydraulic techniques and the like.

Referring now to FIG. 10, an apparatus is illustrated in schematic form for producing fusion energy using a PMK. The apparatus includes a triggering chamber 94, which can be equivalent to the triggering chamber 52 of FIG. 8 or the pressure vessel 64 of FIG. 9. A pair of electrodes 12 and 14 are illustrated in FIG. 10, and are equivalent to those illustrated in the apparatus of FIG. 8 for forming a PMK according to the discharge method heretofore desscribed. When this method of forming the PMK is used, an apparatus for providing ionization energy of the type illustrated in FIG. 8 must be provided. Although such an apparatus is not illustrated in FIG. 10, it will be understood that this apparatus could easily be coupled to the triggering chamber 94 of FIG. 10. Alternatively, the electrodes 12 and 14 could be eliminated, and a plasma gun system of the type illustrated in FIG. 9 could be used to generate the PMK. In this case, the control equipment and shock wave generating system illustrated in FIG. 9 would have to be added to the triggering chamber 94 of FIG. 10. Thus a PMK can be initiated by any technique in the triggering chamber 94 of the apparatus of FIG. 10. Once the PMK is initiated, a fluid pressure system including a fluid pressure source 96 which is regulated by a fluid pressure control 98, is used to compress the PMK. More particularly the fluid pressure source includes a supply of a suitable gas or liquid which is coupled through a pressure line 100 to a suitable plurality of pressure inputs 102 located around the periphery of the ignition chamber 94. It will be understood, of course, that a plurality of remote control valves (not shown) may be used to open or close the pressure inputs 102, if desired. A pressure sensor 104 is preferably located in a portion of the wall of the triggering chamber 94 to provide a feedback indication to the fluid pressure control source 98 as to the actual pressure existing within the triggering chamber 94. In operation, the PMK is first formed and the fluid pressure within the formation chamber 94 is subsequently increased to compress the PMK to a suitable diameter. At this time a mechanical apparatus or an electrical or magnetic field is used to physically transport the PMK into a furnace chamber 106 which is enclosed within a furnace housing 108 mounted to the triggering chamber 94. In FIG. 10 the means for moving the PMK is illustrated as a piston 110 powered by a piston drive apparatus 112. The piston drive apparatus may be a conventional hydraulic unit, an explosive chamber, a combination of hydraulic and explosive devices, or any other suitable power or compression source as is well known to those skilled in the art of compressing plasmoids. An additional pressure sensor (not shown) can also be provided in the furnace chamber 106 to permit a pressure control system to be coupled to the furnace chamber.

The piston 110 is used to move the PMK into the furnace 106, and can also be used to further compress the PMK once it is within the furnace chamber. Alternatively, additional fluid pressure in the form of a gas or liquid of fusionable nuclei can be supplied from a fuel supply source 114. A variable pressure source 116 can also be used to further increase the pressure in the furnace chamber in conjunction with the action of the piston 110. An energy exchange apparatus 118 is coupled to the walls of the furnace chamber 106 by means of a conduit 120 which can be used to circulate a cooling fluid, such as liquid lithium, or any other suitable reactor cooling fluid through a network of cooling passages in the walls of the furnace chamber 106. Naturally, the art of energy transfer is highly developed, and any suitable prior art energy transfer apparatus or system can be used in lieu of the device schematically illustrated in FIG. 10. Not having to cool within magnetic confinement coils is a great advantage of this invention over tokamaks and similar large coil confined toruses.

The dimensions and construction of the apparatus illustrated in FIG. 10 are dictated by the size and power output of the PMK desired. Accordingly, the apparatus illustrated in FIG. 10 vary widely in size. However, the figures set forth earlier with regard to the structure illustrated in FIG. 8 apply to the structure of FIG. 10. The structure of FIG. 9 may be smaller depending on the initial pressures achieved.

In the apparatus of FIG. 10 mantle compressions of 10,000 atmospheres and more can be obtained using conventional state of the art techniques. With such increases in pressure, the energy concentration within the kernel of the PMK will increase dramatically, thereby substantially increasing the temperature and density of the PMK, and possibly its lifetime. If the initial size of the PMK is sufficiently large, the increase in pressure and decrease in volume can easily result in an increase in the kernel plasma energy to produce a temperature above nuclear fusion ignition whereby fusion will occur within the furnace chamber 106. For supplying a continuous output of fusion power, it is contemplated that a battery of devices of the type illustrated in FIG. 10 may be constructed and energized sequentially. Thus each device will provide energy output as its PMK burns, and as the PMK burns out, subsequent formation and furnace apparatuses are energized to continue generating the output power. Other continuous output systems are described in detail subsequently.

At this point we shall make a few sample calculations or parameters of a useful size PMK or PLASMAK. Of course a great range of parameters are available which are of interest in fusion applications. The instant invention can be successfully practiced using many combinations of the disclosed methods and apparatus. Since the cleanest and most productive method for many applications is the preferred mode of practice of the instant invention it is considered here as follows where the physical parameters incorporated below are arbitrary.

Since the PMK operates well above the Lawson Criterion and is not a marginal fusion device, only simple and crude estimates of its pre and post compression states are made. Utilizing ad hoc (more conservative) modifications to the scaling laws of Furth and Yoshikawa (1970) we have calculated the following table. (See Table I)

Here a PMK, mantle diameter 25 cm, is formed and initially embedded in gas of Deuterium Tritium ratio 1:1 at a pressure of one atmosphere. After a period of preheating, the kernel plasma will be heated to 500 eV by a combination of auxiliary methods and energetic electron currents with a toroidal component of 1.3 megamps. Before compression the kernel has a major radius of 3.1 cm and a minor radius of 1.4 cm, yielding an aspect ratio of 2.2. The volume is 120 cc and the electron density is $1.9*10^{17}$/cc. Table 1 below summarizes parameters before and after compression.

TABLE 1

| | C = 3.5 COMPRESSION RATIO | | |
|---|---|---|---|
| φ | SCALE | PRE (1 ATM) | POST (.6 KATM) |
| T | $C^{2.3}$ | .5 KEV | 7.9 KEV |
| I | $C^2$ | $1.3 * 10^6$ AMP | $1.6 * 10^7$ AMP |
| P | $C^{2.5}$ | .9K ATM | 250K ATM |
| V | $C^{-2.7}$ | /20 cc | 4 cc |
| η | $C^{2.7}$ | $1.9 * 10^{17}$ | $5.5 * 10^{18}$ |
| $E_{PMK}$ | $C^2$ | 100 KJ | 0.6 MJ |
| β | | .14 | .24 |
| $E_{PMK}$ | | | .5 MJ |
| $E_{PMK}$ | | | $15.5 * 10^6$ J |
| Q | | | $6 = \dfrac{.5 * (15.5 * .5 * .5 * .4/3)}{.5 * .5 * .4}$ |
| τ | | | 20 msec |
| n = τ | | | $10^{17} \dfrac{\text{sec}}{\text{cm}^2}$ |

Since operational temperatures of this reactor can be quite high, we expect to recover 50% of the compression and fusion energy, and, in addition, 25% of the energy of formation of the PMK. Of the formation energy of four hundred kilojoules, for example, about one hundred kilojoules will end up in the PMK's kernel fields. During compression 50% of the compression energy may be lost so that the kernel fields of this fully compressed PMK might contain about six hundred kilojoules.

Calculations of Bremsstrahlung losses from the kernel account for about 25% of the half of a megajoule allowed for losses. Because of the low density and temperature of the uncompressed PMK, the greater fraction of Bremsstrahlung is lost near its fully compressed state.

For example, $$\text{if} \quad n_e = \tfrac{1}{2}n = 2.75 * 10^{18}/\text{cc}$$
$$T = 8 \text{ KeV and } V = 4 \text{ cc}$$
$$P_{Br} = 1.69 * 10^{-32} * N_e * T_e^{\frac{1}{2}} \text{ w/cc}$$
$$\text{then} \quad P_{Br} = 1.69 * 10^{-32} * (2.75 * 10^{18})^2 * (8000)^{\frac{1}{2}} * 4 \text{ cc}$$
$$\text{or} \quad P_{Br} = 46 \text{ megawatts.}$$

At 8 KeV the fusion power retained within the kernel plasma through charged particle products will be more than adequate to make up power losses through Bremsstrahlung as is shown below. Assuming the average loss rate is one half the value at 8 KeV, during a very slow compression of five milliseconds the accumulated losses are:

$$K_{Br} = 5 * 10^{-3} * 46 * 10^6/2$$
$$K_{Br} = 114 * 10^3 \text{ joules, or a little more}$$
than one hundred kilojoules.

While holding a PMK for 15 milliseconds prior to compression the kernel Bremsstrahlung losses would be less than five kilojoules.

The fusion heating of the kernel plasma at 8 KeV (not including neutron flux) is $$P_{Br}(8) = 5.6 * 10^{-13} * n_p * n_T * (\sigma * v) *$$
$$V * 8 \text{ KeV watts}$$
$$= 5.6 * 10^{-13} * (1.375 * 10^{18})^2 *$$
$$5.2 * 10^{-17} * 4$$
$$= 220 \text{ megawatts, or about four}$$
times the Bremsstrahlung less rate.

Not recovering any kernel Bremsstrahlung radiation before and during compression takes about ¼ of the energy we have set aside for losses. Of course, much of the Bremsstrahlung is recovered through a process of Self Compression Heating which is described in the discussion of FIG. 12 below.

After ignition the heating of the kernel plasma by the fusion reaction will raise its temperature to well above 8 keV, at which point the Bremsstrahlung and its plasma trapped fusion reaction power will be in equilibrium. This will result in faster burning of the fuel so that it should be easily consumed within 20 milliseconds. The estimated burn rate is about 800 megawatts at 8 KeV (including energy carried off by the neutrons) and the energy of the burn where N is $0.55*10^{19}$ fuel pairs is:

$$E_F = N * 1.6 * 10^{-19} \text{ J/eV} * 17.6 \text{ MeV}$$
$$= 15.5 \text{ MJ, so that the time for the burn is}$$
$$t_f = K_g/P_f = 20 \text{ milliseconds}$$

The buildup of the reaction product, helium, can nearly double the Bremsstrahlung loss rate and also slow the reaction rate. The initial high density and temperature of the kernel plasma, well in excess of 8 KeV, should provide a thermal environment to achieve a very high burn efficiency.

Assuming cyclotron radiation is saturated for the thermal electrons over the wave band from the minimum wavelength to infinity, the estimate for the maximum radiated power by using the Rayleigh-Jeans radiation law can be made.

For the uncompressed kernel the rate is a few tens of watts and for the fully compressed kernel the rate is about 80 kilowatts. The rate is low because the area of the fully compressed kernel is small and higher order harmonics are not expected due to the relatively smooth magnetic surface. However, the frequencies involved are in the infrared and are easily reflected by the mantle and surrounding metal surface and the like, especially as described in FIG. 12 below. Consequently, this loss mechanism is not a serious problem. It is noted that a toroidal radiating structure centered and aligned in a reflecting ellipsoidal cavity is positioned within its own image. The PMK configuration is ideally suited for this technique of reflecting cyclotron radiation back into its central plasma.

Once formed before compression the decay of the magnetic energy makes up the power lost through various mechanisms. The rate of this decay $d(\tfrac{1}{2}Li^2)/dt$ provides an EMF which tends to maintain currents against ohmic heating losses. Highly conducting runaway electrons produced in the current stroke during the initial high voltage surge will diminish in number and energy quite rapidly and fortunately at an accelerated rate once the driving EMF falls below a certain keep alive value well known to those skilled in the art of producing relativistic currents in accelerating fields. Consequently the effective resistivity can increase over several orders of magnitude and the associated power consumption will change correspondingly.

PLASMAKS with relativistic electron currents can be stored for quite some time. The kernel plasma will not be heated to suitable precompression temperatures unless resistivity increases sufficiently in time or auxiliary heating methods are used. For example, laser pulses or alternately a short series of powerful compression and relaxation heating cycles may be used. These and other means can be used to excite an anomalous resistivity in the kernel plasma. Such effects as two stream instabilities might be induced with the injection of localized charge or current anisotropies via beam guns and the like.

PMKs with thermal electron currents, on the other hand, must be compressed immediately. This is because the resistivity is more than adequate to sufficiently heat the kernel plasma to appropriate precompression temperatures quickly and the lifetime of the kernel barrier fields is short because of their associated rapid dissipation.

For the case under study an effective resistivity associated with currents of runaway electrons with a mean energy of 25 KeV is quite appropriate. Much less electron energy would require a fast compression as is found in liner experiments. On the other hand, MeV energies give long storage times on the order of tens of seconds.

For example, the resistivity is $$\eta = 5.2 * 10^{-3} * (\ln \Lambda)/T^{3/2}_{ieV}$$

where $\Lambda = 760 * [KT_{(eV)}/n]^{\frac{1}{2}} * n_e * (c/e)^2$

Resistance $R = \dfrac{\eta * 2 * R}{r^2}$

Barrier Field decay time $t_\eta \times \frac{1}{2}L/R$

Ohmic heating power $P_\eta = I^2 * R * \sigma$ where $\sigma$ is the current cross section to plasma cross section ratio, estimated to be 0.3.

Table 2 lists parameters related to the resistivities associated with currents having mean particle energies of 25 KeV and 2 MeV. The resistivity of copper is included for comparison.

TABLE 2

| x | COPPER | 25 KeV | 2 MeV |
|---|---|---|---|
| $\eta$ | $2 * 10^{-6}$ sec | $3 * 10^{-8}$ sec | $5 * 10^{-8}$ sec |
| R | $6 * 10^{-6} \Omega$ | $10 * 10^{-8} \Omega$ | $1.5 * 10^{-8} \Omega$ |
| $\tau(\frac{1}{2}L/R)$ | 5.5 msec | 115 msec | 75 sec |
| $P_\eta$ | 11 Mw | 550 KW | 900 W |
| $T(P_{\sigma r} = P_\eta)$ | ~ | 890 eV | BEAM UNUSED COLD PLASMA |

It should be noted that the parameters included in this case produce a kernel plasma with a somewhat D shaped cross section as opposed to a circular cross section. An increase in $\beta$, the ratio of the particle energy to magnetic energy, occurs during ohmic or auxiliary heating, compression heating to ignition, and subsequent fusion burn heating. This will cause the kernel plasma to become "fatter", that is its aspect ratio decreases. This effect has been viewed in the plasma physics literature to increase stability.

Considerable art and technical skill is involved in forming PMKs with characteristics which are finely tuned to each specific application.

Figure 12:
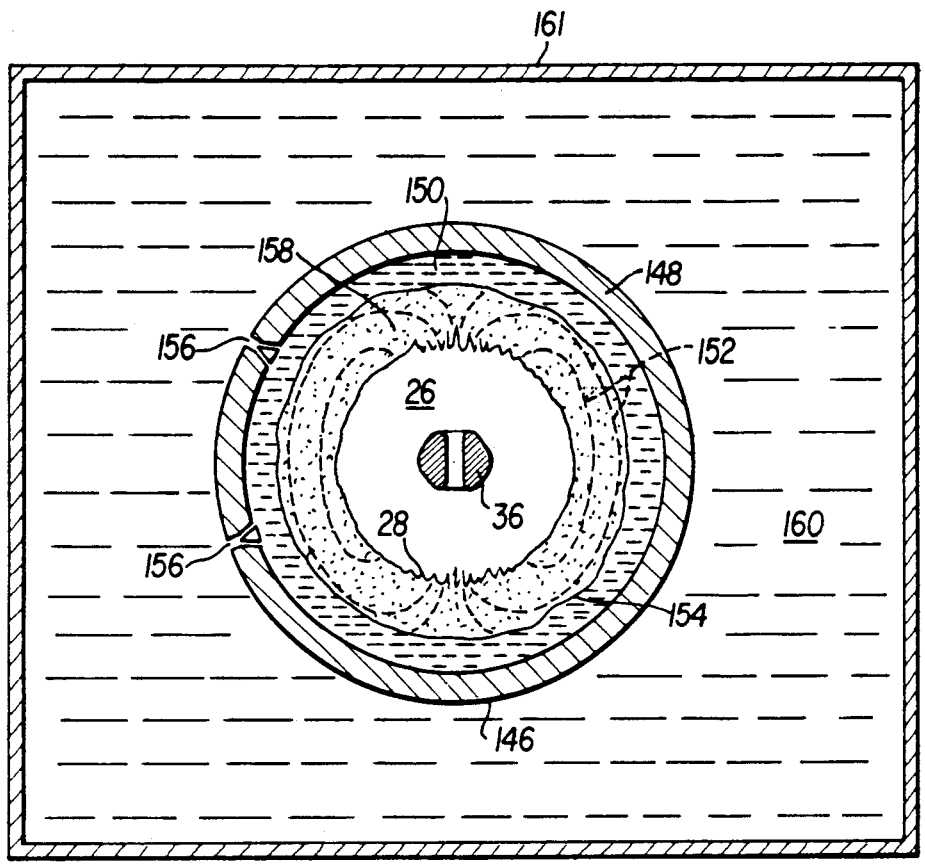
FIG. 12 illustrates more detail of regions and structures in a securely closeable and detachable high pressure chamber containing a self compressing PMK.

FIG. 12 illustrates a securely closeable and detachable high pressure chamber or furnace 146 in which the actual nuclear fusion burn takes place. A conventional twist lock mechanism and high pressure seal can be utilized to close the chamber using a detachable portion of the piston which then becomes part of the chamber wall. This chamber may, for example, be equivalent to the structures shown in FIGS. 8-11, but is readily detachable from all external apparatus using conventional quick disconnect coupling devices. In its preferred embodiment the uncompressed PMK can have a significant stability and lifetime on the order of tens of seconds. And during this time period it can be transported into a remote region for fusion energy release.

The high pressure wall 148 is illustrated containing a region of liquid metal 150 and a region of ionized or unionized gas 158 surrounding the primary mantle 28 and vacuum field region 26 and plasma ring 36 of the kernel.

The stray magnetic field 152 in region 158 may be partially trapped by the interface between liquid metal region 150 and gaseous region 158 forming a secondary mantle. Check valves 156 allow the injection of liquid coolant into the chamber but prevent the back flow of liquid metal from region 150 except in controlled amounts. Liquid metal coolant in region 150 protects wall 148 from certain radiations from the kernel plasma or hotter portions of the mantle, and it also insulates wall 148 by minimizing the contact with and absorption of light nuclei or the fusionable fuel in the ionized gaseous region 158 or the primary mantle 28.

After compression heating of the plasma kernel by previously described techniques to some point near initial fusion temperatures, the radiation cooling loss from the kernel plasma will be partially offset by captured energy of the kernel plasma, which is released by the fusion reaction. For example, Bremsstrahlung radiation itself is captured by the fluid matter of regions 158 and 150 and the primary mantle 28. The radiation is then thermalized increasing the nKT energy of the gases or plasma of region 158 or mantle 28. In addition, the expansion or boiling or sublimation of the radiation thermalized matter in region 150 or the inner surface region of the chamber wall 148 will increase the pressure within the chamber 146. This contributes to the compression heating of the kernel 36, and this effect is called herein SELF COMPRESSION HEATING. When the kernel reaches temperatures where the radiation cooling power is less than the fusion output and self compression heating power combined, no further application of external compression energy is needed. This effect produces much higher efficiencies and makes it possible to burn cheaper fuels (i.e., high deuterium: tritium ratios) or even so called super safe or exotic fuels which produce essentially no radioactivity. It is noted that the exotic fuels are well suited to this technique since they radiate most energy in the form of Bremsstrahlung and little or no radiation in neutrons. Neutrons are poorly suited for inducing self compression in compact devices, except where they are absorbed into nuclei which fission to produce multiple nuclei especially of gaseous atoms.

The chamber wall may be surrounded by a coolant bath 160 contained in a coolant vessel 161. In addition to energy extraction, this bath 160 can be used to isolate or transfer a PMK loaded compression chamber. Another advantage of using a detachable compression chamber is that it allows faster cycling and it can be replaced or repaired or refurbished without interrupting the power cycle. The coolant bath 160 can be continuously circulated through a cleaning or replacement processing without interruption of or shutdown of the reactor.

Figure 13:
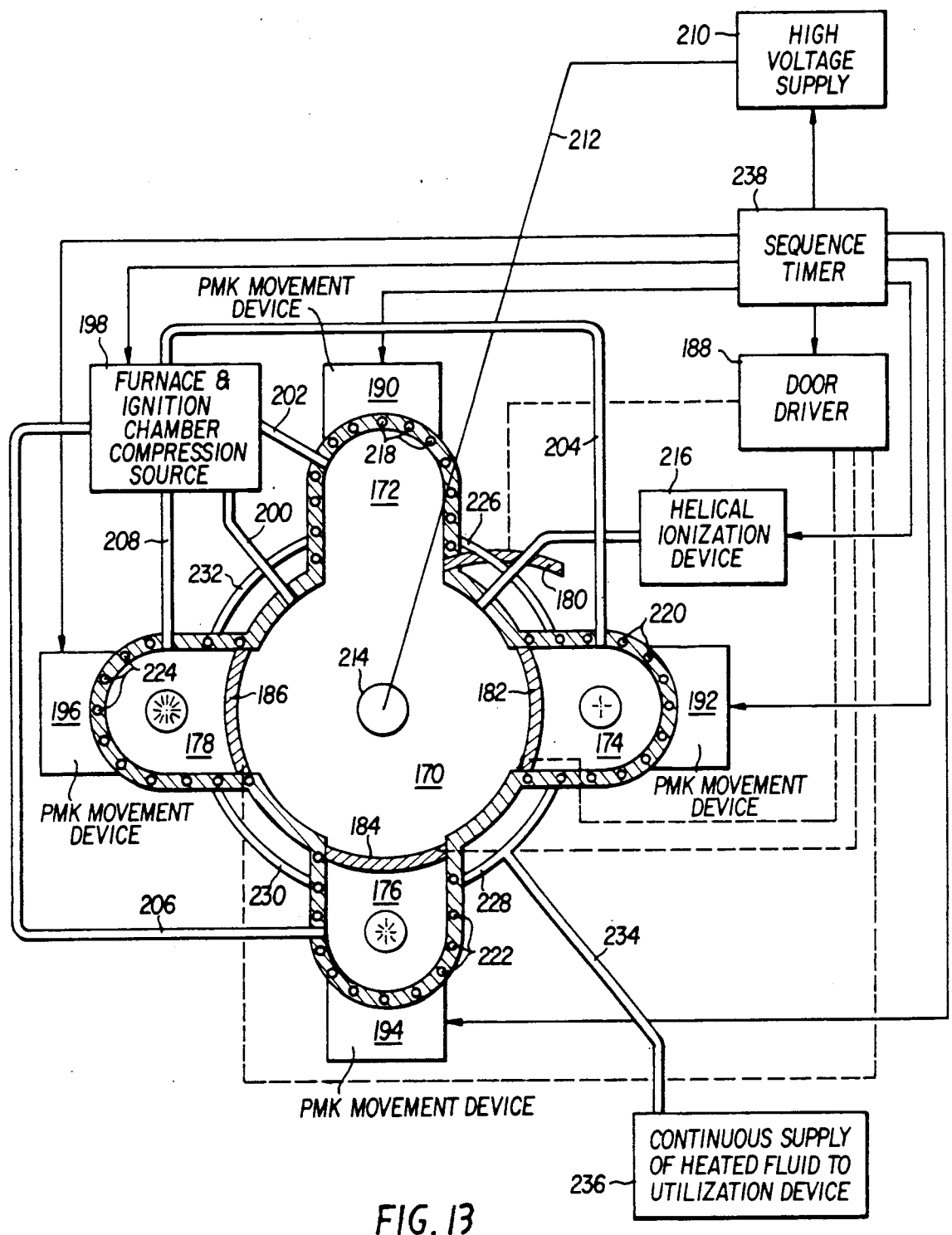
FIG. 13 illustrates a multi-chambered reactor.

Another type of fast cycling reactor that can provide an uninterrupted power cycle is illustrated in FIG. 13. The apparatus of FIG. 13 may incorporate any or all of the formation, compression and control techniques previously described in all other illustrated embodiments of the invention, and is intended primarily to illustrate how a continuously cycling reactor can be constructed using the PLASMAK energy configuration in accordance with the present invention.

More particularly, the apparatus illustrated in FIG. 13 includes a formation chamber, which is somewhat similar to that illustrated in FIG. 10 with the exception that it includes a plurality of furnace chambers 172-178 located around its periphery. Although four furnace chambers are illustrated, it will be understood that the present invention is not limited by the illustrated number of furnace chambers, and fewer chambers can be used or more chambers can be added. Furthermore, it is not necessary that the chambers all be located in the same general plane, as shown in FIG. 13, but may be oriented in multiple planes in three-dimensional space. Furthermore, the furnace chambers need not necessarily be arranged in a radial pattern, but can be arranged in a linear configuration.

Each of the furnace chambers includes a corresponding pressure-tight door 180-186 for isolating the individual furnace chambers from the central formation chamber 170. Each of the doors is mechanically connected to a door driver, such as a conventional electrical or hydraulic motive-power system, for physically opening and closing the furnace chamber doors. Each of the furnace chambers is also equipped with a PMK movement device 190-196. These devices are used to move a newly formed PMK into a selected one of the four furnace chambers. They can be conventional vacuum devices which when activated would withdraw a portion of the atmosphere from the connected furnace chamber, and thus create a net flow into the furnace chamber to draw the newly formed PMK into the furnace chamber. Alternatively, the PMK movement devices may be tractor coils (which may be simply electromagnets) which, when energized, would attract the magnetic PMK. Similarly, the PMK movement devices may simply be electrostatic devices which would tend to attract the newly formed PMK. Alternatively, repulsion devices could be utilized, although these would have to be energized from an opposing direction. For simplicity in describing the embodiment shown in FIG. 13, it is assumed that the PMK movement devices are simply electromagnets.

A furnace and formation chamber compression source 198 is coupled to the formation chamber 170 via a pressure line 200 and to the four furnace chambers 172-178 by pressure lines 202-208. The furnace and formation chamber compression source may simply be a conventional source of high pressure fluid and a conventional valving arrangement which permits pressure to be delivered selectively to the formation chamber 170, or to any one of the furnace chambers. A high voltage supply 210 is coupled via a line 212 to a formation electrode 214, as in previously described embodiments of the invention. A helical ionization device 216 is coupled to the formation chamber 170 for establishing the initial conditions for formation of the PMK, as previously described. The helical ionization device and the high voltage supply could clearly be replaced with a plasma gun as shown in the embodiment of FIG. 9, and a charged particle beam gun, and other elements such as a purifying system as shown in FIG. 11 could be utilized with the system, as will be apparent to those skilled in the art. Similarly, the helical ionization device 216 can be arranged as the flashlamp and reflector system of FIG. 11, although other equivalent structures could equally well be used.

Each of the furnace chambers 172-178 is equipped with a conventional heat transfer or energy exchange apparatus 218-224 which may be equivalent to that illustrated in FIG. 10. The energy exchange apparatus is illustrated in the form of cooling apertures or channels in the walls of the furnace chambers through which a heat transfer vehicle such as a liquid metal may circulate. The energy exchange apparatuses of each furnace chamber are coupled by means of fluid collection line or lines 226-232 so that the energy exchange apparatuses of the entire furnace are united and so that the energy transfer medium flows in parallel or series through all of the devices and all of the furnace chambers. An output line 234 is illustrated for delivering a continuous supply of heated fluid to a utilization device, as illustrated at 236. The input and distribution lines are not shown.

A conventional sequence timer 238 is coupled to the various components of the system to insure that the apparatus cycles in a continuous manner. Although the sequence timer 238 may be a conventional microprocessor with appropriate programming, it may be a very simple conventional timing apparatus operating in accordance with the flow chart illustrated in FIG. 14 since the general sequencing of the apparatus of the present invention is not unlike that of a four-cylinder internal combustion engine. Thus the sequence timer 238 is well within the general knowledge of those skilled in the art of time control of cyclical reaction events. Naturally, much more sophisticated systems could be constructed with pressure, temperature and environment monitors coupled to each of the furnace chambers and to the formation chamber, as well as to various components of the energy exchange network and other individual components of the system, and all of these sensors could feed to an appropriately programmed central computer so that the parameters would provide feedback information for more precise control of the system. The addition of such monitoring equipment and the programming of a conventional computer to accommodate such equipment is also considered conventional and well within ordinary skill in the art. Before describing the operation of the system, it is specifically noted that the sequence timer 238 is coupled to the individual PMK movement devices 190-196 for switching these devices on and off, and also to the door driver 188 for selectively controlling the furnace chamber doors 180-186. The sequence timer is similarly coupled to the furnace and formation chamber compression source 198 for selectively delivering pressurized fluid to the formation chamber 170 and to the individual furnace chambers 172-178. Finally, the sequence timer is connected to the helical ionization device 216 and to the high voltage supply 210 for triggering these two components of the system.

Figure 14:
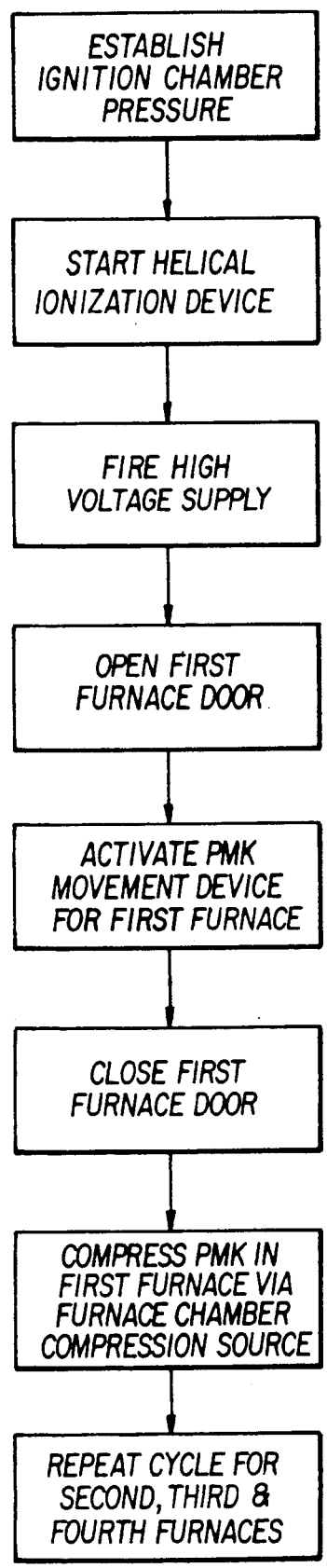
FIG. 14 is a high level flowchart for a firing sequence.

In operation, the sequence timer initially activates the furnace and formation chamber compression source 198 to establish the proper pressure in the formation chamber 170, as illustrated at the top of the flow chart in FIG. 14. Next the sequence timer starts the helical ionization device to establish the helically ionized path which is important to the PMK formation, in accordance with the teachings of the present invention. Subsequently, the high voltage supply 210 is triggered to form a PMK within the formation chamber 170. Prior to this time it is assumed that all furnace chamber doors 180–186 are closed, so that each of the furnace chambers are isolated from the formation chamber. Once the PMK is formed, a first furnace chamber door is opened, such as furnace chamber door 180 of furnace chamber 172. The sequence timer next activates the PMK movement device 190 associated with furnace chamber 172 for drawing the newly formed PMK into furnace chamber 172. The furnace chamber door 180 is then closed and pressure from the furnace and formation chamber compression source 198 is then delivered to the furnace chamber to compress the PMK in the furnace chamber as it burns. The cycle is then repeated and a second PMK is formed in the chamber 170. This PMK is then drawn into one of the other furnace chambers, such as the furnace chamber 174. The cycle continues until all furnace chambers contain PMKs. The timing of the system is related to the life of the PMK, in accordance with the previously discussed teachings of the invention, so that once the fourth furnace chamber is filled, the PMK in the first furnace chamber is essentially burned out and the chamber cooled by the heat exchanger; the chamber may then be opened and a newly formed PMK can be drawn into it. In this manner the four chambers continuously cycle, each having a PMK at a different stage of its life burning within it. The output of the system is withdrawn by means of the energy exchange apparatus and supplied in a continuous fashion and supplied to a conventional utilization device, such as a steam driven electrical generator. It will be apparent from the foregoing discussion that different cycling arrangements can be used for supplying PMKs to the different furnace chambers, and various other modifications of the system illustrated in FIG. 13 can be used in accordance with other teachings of the present invention, since the system of FIG. 13 is fully compatible with all other systems and embodiments of the present invention as previously disclosed. For example, the furnace chambers 172-178 may be made entirely detachable in accordance with the embodiment of the invention illustrated in FIG. 12. Thus the centralized formation chamber and control systems illustrated in FIG. 14 can be utilized in conjunction with the embodiment of FIG. 12.

In a sophisticated system in accordance with the present invention, the following system control functions must be performed:
  Setup of initial conditions
  Sequencing of events throughout the cycle
  Sequencing of cycles
  Feedback to correct minor deviations from nominal
  Response to severe abnormal conditions
  Operator status displays and control panel monitoring.

Figure 16:
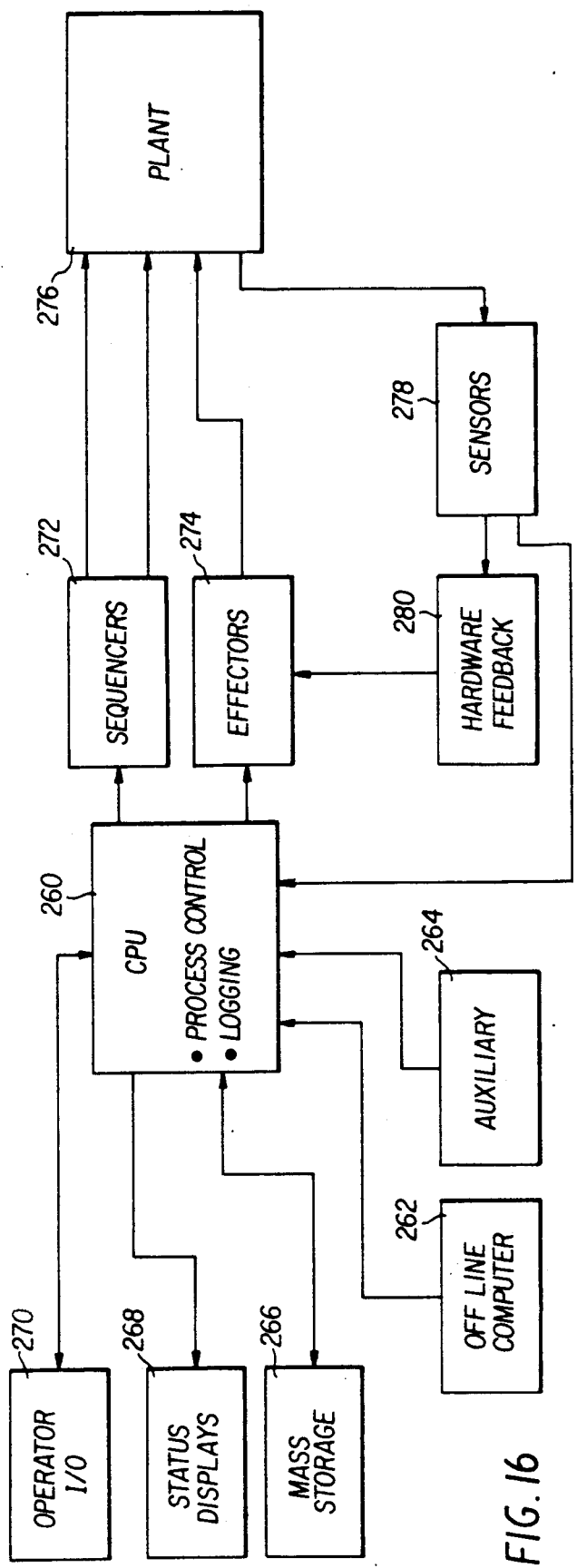
FIG. 16 illustrates an overview of the power plant flow of control and data.
Figure 17:
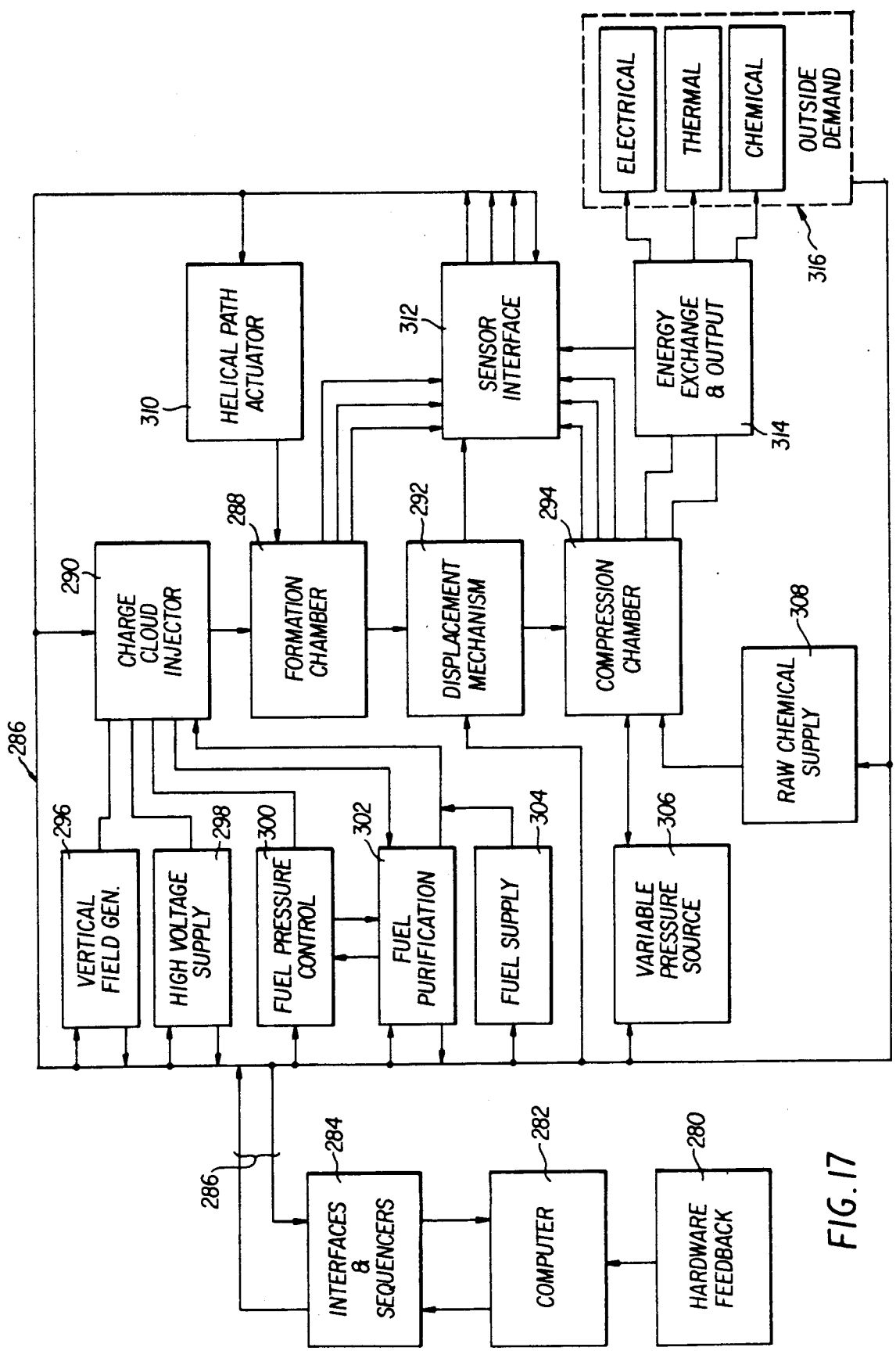
FIG. 17 illustrates a more detailed flow of control among the physical devices and between them and the process control computer.
Figure 19A:
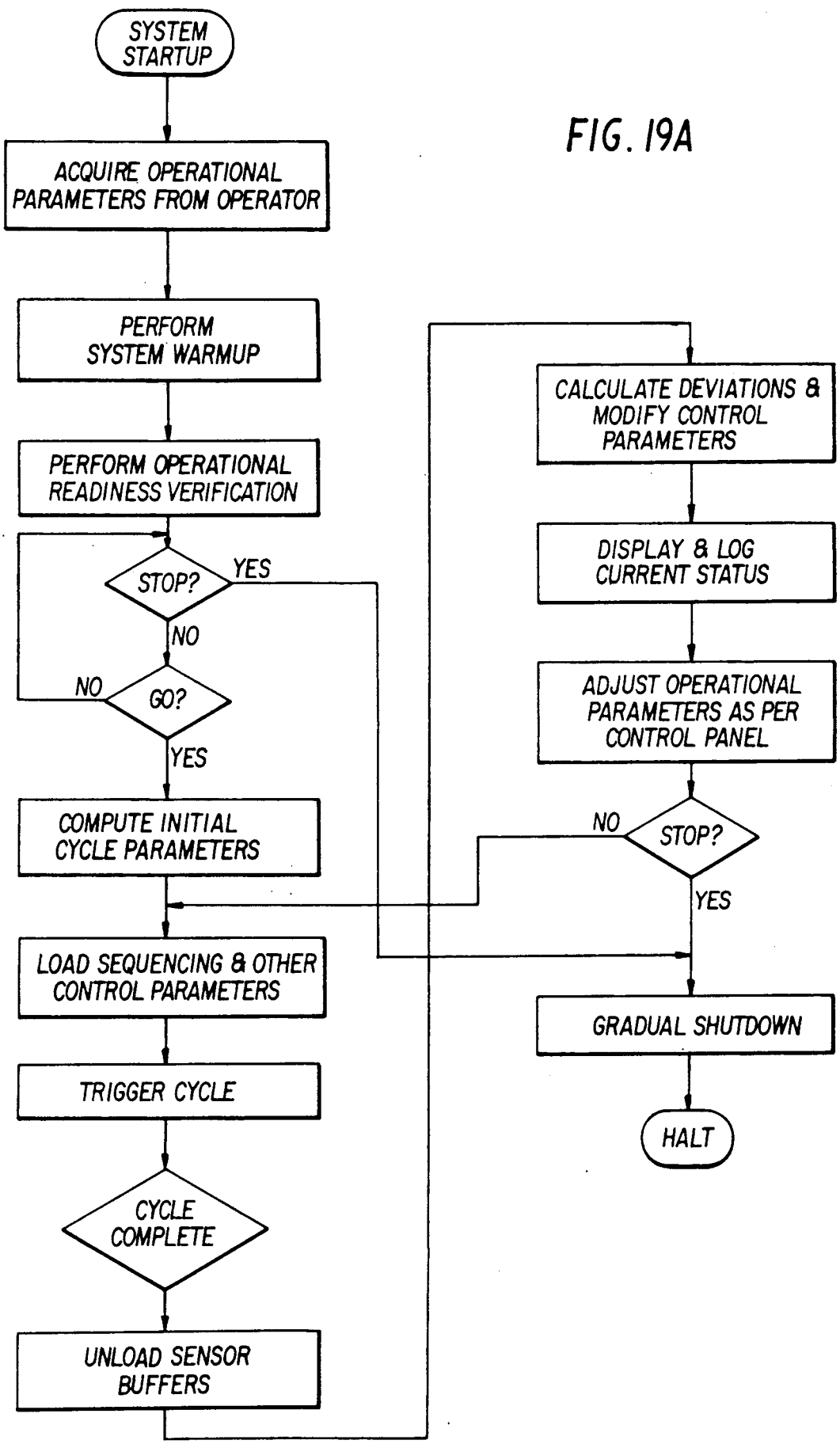
FIGS. 19A, 19B and 19C are flowcharts giving a high-level description of the typical software processing required.

An overview and more detailed flow diagram of control and data within a more sophisticated system such as a reactor plant is illustrated in FIG. 16 and FIG. 17. Referring particularly to FIG. 16, a large central processing unit 260 is shown as the heart of a large-scale control system. The central processing unit 260 may be used for general process control functions as well as storing and interpreting feedback information from the physical system, as is well known to those skilled in the art. Programming of the CPU to accomplish the necessary process control functions is conventional and would be fully understood by those skilled in the art in view of the teachings of the present invention. Nevertheless, a flowchart indicating the basic programming arrangement is illustrated in FIGS. 19A, B and C, which will be described in more detail subsequently. It is noted that the Central Processing Unit and system of FIG. 16 may be used in place of the simple sequence timers illustrated in FIGS. 11 and 13 when the systems are put into use in a sophisticated power-producing plant.

Coupled to the Central Processing Unit 260 in the diagram of FIG. 16 are an offline computer 262, auxiliary equipment 264, a mass storage unit or high-volume memory 266, a status display 268, and an operator input-/output unit 270. Outputs of the CPU are coupled to a plurality of sequencers 272 and a plurality of effectors or actuators 274. The outputs of these elements are in turn supplied to the actual energy producing plant, designated as 276 in the figure. Feedback is provided by means of a sensor network 278 and hardware feedback equipment 280, in the nature of limits which is in the like. All this equipment is conventional and its application to power generating systems is well known.

FIG. 17 illustrates a computerized control network which can be used to control one of the PMK producing apparatuses of the present invention as previously described and illustrated in FIGS. 8-13, for example. The system of FIG. 17 includes a central computer 282, which may be equivalent to the computer 260 illustrated in FIG. 16. These computers may, for example, be conventionally available units such as a PDP 1170, a VAX-11/780, an AMDAHL 470/V6 or an IBM 370/137, for example. The computer is coupled through an interface and sequence network 284 by means of a bi-dimensional information bus 286 to the various system components under control. All system components may be coupled together with one another and with the computer 282 by means of a conventional data communications system, such as that disclosed in U.S. Pat. No. 3,898,373. Clearly, those skilled in the art will appreciate that other types of data communications systems can also be used to interconnect the various illustrated components.

The system under control is intended to be a generalized system incorporating all of the features illustrated in the systems shown and described in FIGS. 8-14. Specifically, the system of FIG. 17 includes a formation chamber 288 having a charge cloud injector 290 coupled thereto. A PMK displacement mechanism 292 is shown coupled to the formation chamber and is intended to be analogous to the PMK movement devices illustrated in FIGS. 10 and 13. A compression chamber 294 is shown cooperating with the formation chamber and displacement mechanism. This chamber is equivalent to the furnace chambers illustrated in FIGS. 10 and 13. A vertical field generator 296 is shown coupled to the formation chamber as is a high voltage supply 298.

A fuel pressure control 300 is shown coupled to the formation chamber 288 and to a fuel purification system 302. A fuel supply 304 is coupled to the fuel purification system 302. A variable pressure source 306 is coupled to the compression chamber 294 as is a raw chemical supply 308. A helical path actuator 310 is shown coupled to the formation chamber for providing the helical path discussed throughout the present application. A sensor interface 312 is shown for receiving sensory outputs from the formation and compression chambers to be fed back to the computer 282 for processing and analysis. An energy exchange and output device 314 is coupled to the compression chamber and is analogous to the energy exchange arrangement illustrated in FIGS. 10 and 13. The outputs are delivered to external utilization devices 316 illustrated as being electrical, thermal and chemical utilization devices for satisfying outside energy demand.

Figure 18:
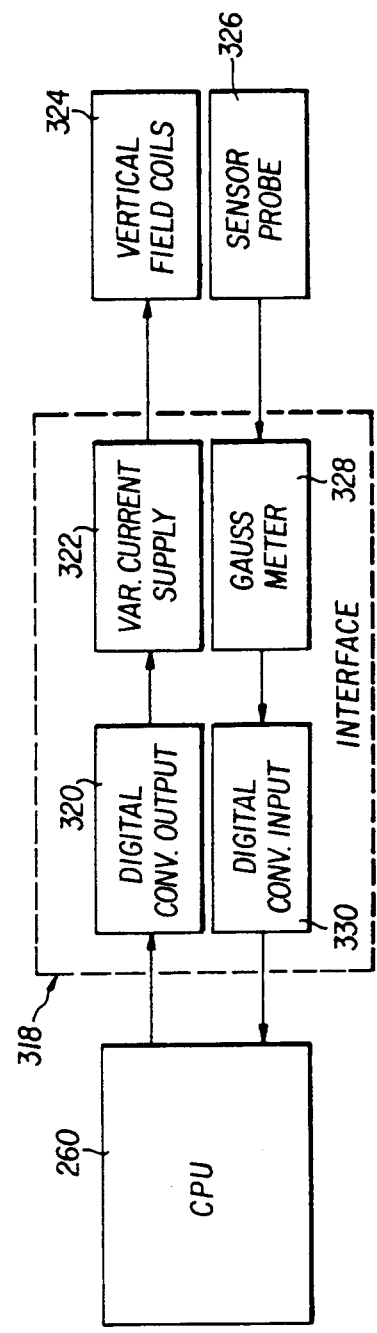
FIG. 18 illustrates a typical interface between the control computer and a physical device.

FIG. 18 illustrates in more detail a typical interface arrangement that can be used in the system of FIG. 17. More particularly, the interface 318 illustrated in FIG. 18 may be incorporated into the block labeled 284 in FIG. 17. The interface 318 includes a digital converter output 320 and a variable current supply 322 coupled to the vertical field coils 324. The vertical field coils are equivalent to the vertical field generator 296 illustrated in FIG. 17. Similarly, an input to the computer is shown in FIG. 18 as including a sensor probe 326 which supplies its input to a gauss meter 328 within the interface 318. The gauss meter supplies its output to a digital converter input 330 which in turn supplies digital signals to the central processing unit 260.

Attention is now directed to FIG. 19a which represents a high level description of a typical software processing flowchart for use in programming the previously described computers for operating a sophisticated system in accordance with the present invention. As shown in FIG. 19a, the flowchart includes system startup and acquisition of operational parameters from an operator. The system is subsequently warmed up in accordance with the flowchart diagram and operational readiness verification is performed. If the system does not meet the initial readiness tests, it is gradually shut down. On the other hand, if it meets the readiness tests the procedure is advanced and the initial cycle parameters are computed. Load sequencing and other control parameters are subsequently calculated and the trigger cycle is initiated to fire the high-power current stroke within the formation chamber. The triggering cycle is then completed by appropriate controls of the system and the sensor inputs are subsequently unloaded from the sensor buffers. The sensor data is used to calculate deviations from the ideal and to modify control parameters to approach more closely ideal projected conditions. The data is then displayed and the current status of the apparatus is logged. Additional operational parameters may at this point be inserted through the control panel. The system may subsequently be recycled to repeat the triggering cycle or may be shut down if operation is to be haulted.

Figure 19B:
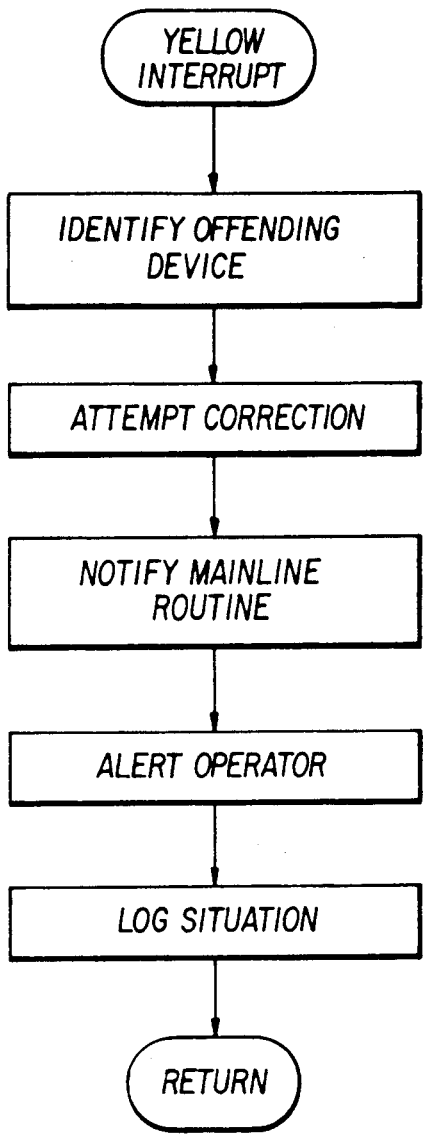

Referring now to FIG. 19b, a safety interrupt designated as a "yellow" interrupt operation is shown in flowchart format. This interrupt occurs when a malfunction is identified somewhere in the system. The offending device is first identified and an attempt to correct its defect is then made. The mainline computer routine is notified of this attempt at correction and the operator is alerted. The situation is logged and the program sequence is returned to normal provided the interrupt does not require full shutdown.

Figure 19C:
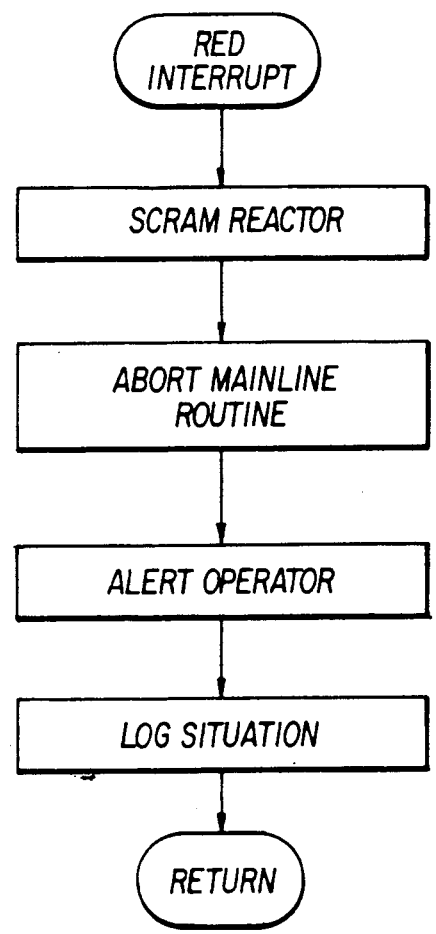

FIG. 19c illustrates a "red" interrupt in the computer program. This interrupt indicates a serious defect in the system which could cause danger to personnel or system destruction and accordingly requires shutdown of the system if no remedy can be determined. Under this program the reactor is first scrammed and the mainline routine is aborted. The operator is alerted and the situation is subsequently logged.

These general flowchart arrangements will be clearly understood by those familiar with the art of computer programming to indentify the specific programming steps required to cause the previously indentified computers to operate in conjunction with the system of the present invention.

For problems relating to system safety, reliability, security, and economy, human supervision occurs at a high level while lower level process control is accomplished via conventional real time computer software and hardware techniques. Typically, intra cycle events are controlled by programmable hardware sequencers or feedback systems. Parameters for these devices are generally modified on an inter cycle time scale.

Fusion reactors releasing significant numbers of neutrons must be carefully controlled so as to prevent the accumulation of hazardous matter. Super sensitive detection equipment for measuring the presence of hazardous material, especially the presence of certain heavy elements, must be maintained at strategic locations throughout the reactor facility, with readout recorded in tamper proof storage and display devices and transmitted to real time reporting monitors located in on-site user security groups as well as in on-site and remote stations operated by the appropriate civil authorities.

Figure 15:
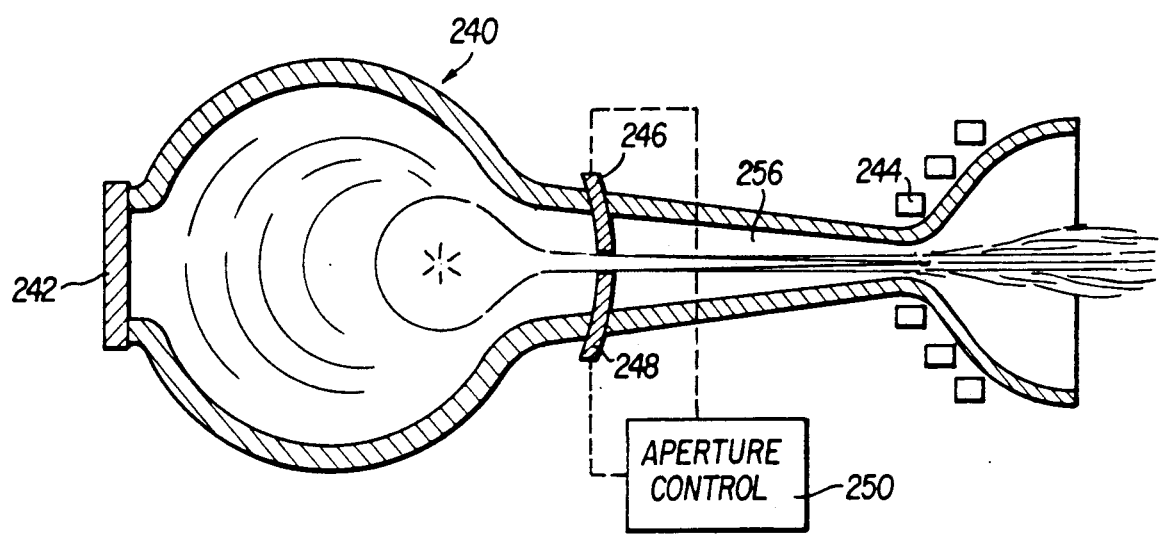
FIG. 15 is a schematic arrangement of a furnace chamber with a plasma ejection chamber.

By redesigning somewhat the configuration of a furnace chamber, the invention can be used to form a very powerful plasma jet or torch, as illustrated in FIG. 15. Specifically, an elongated drift section or region 256 and furnace chamber 240 is provided having a PMK inlet door 242 at one end thereof and a jet nozzle or magnetic aperture 244 at the other end thereof. The PMK inlet door 242 is considered to be equivalent to the pressure-tight doors 180-186 illustrated in FIG. 13, or other figures in the present application. The jet nozzle 244 is initially isolated from the main cavity of the furnace chamber 240 by a pair of aperture closing elements 246 and 248 which are mechanically coupled to and driven by an aperture control 250. In operation, the PMK is initially fed from a formation chamber through the inlet door 242 to the central cavity of the furnace chamber 240. It is then pressurized, or otherwise brought to optimal pressure while the aperture closing elements remain closed to seal the furnace chamber. The aperture control 250 is subsequently activated to open the aperture closing elements 246 and 248 so that the fusion heated and expanded kernel of the PMK with its associated fields more or less intact can be ejected under tremendous pressure. Subsequent decomposition of the PMK or PLASMAK will occur as it enters the drift section 256 where its residual fields and charged particles are guided or collimated by focusing apparatus, as for example as provided by an externally produced solenoidal field (not shown). The drift region allows time for the plasma to relax to a more quiescent state. Much of energy from plasma waves and excited states emitted during this relaxation can be recaptured thermally or electronically in the drift region 256, as is well known to those skilled in the art of energy conversion. The reaction forces of the expulsion and plasma kinetic energy can be efficiently utilized. For example, MHD techniques can convert most of the plasma energy to electrical energy. Utilization of the PMK in this mode leads to the highest efficiency of thermal to electrical energy conversion.

The thrust or power of plasma ejected from the chamber can be enhanced by introducing at least a partial burn of fusionable or neutron-reactive material in the chamber, and specifically in a region such as 150 or 158 in the illustration of FIG. 12, wherein more details of the PMK are shown. For example, such an auxiliary burn can be initiated by utilizing a low ignition point fuel in the regions 150 and 158 of FIG. 12 and the mantle 28 and a fast-burning, high-energy density fuel in the kernel 36. In a fast powerful compression a pulse or high temperature Bremsstrahlung from the kernel 36 would flash heat the low ignition point fuel to at least partial burn. The expulsion of this plasma along with the kernel plasma ash would produce the desired effect. The thrust and heat of the expelled plasma could be useful as a plasma jet or torch as illustrated in FIG. 15 or in providing a bulk of energetic charged particles to produce powerful particle beams, or it could be utilized to drive a rocket device. Utilizing PMKs in the rocket mode, one can produce engines with highest combined thrust and specific impulse.

Further neutron absorption by certain long lived radioactive material can induce transmutation of their nuclei. One of the effects of this transmutation is to produce species of nuclei which have very short life times. It can happen that the product of the decay of the transmuted element is either stable or another short lived nucleus which itself is stable, etcetera. In this casde the neutron absorption can not only release useful thermal energy by inducing radioactive decay, but as a by product it can result in the clean up stores of deadly radioactive waste. Of course, additional efficiencies can be obtained when coupled with other well-known heat extraction techniques.

In addition to applications to nuclear chemistry, the PLASMAK is suited to provide energy for the production of synthetic fuels. For example, utilizing this concept in the plasma jet mode described above, the kinetic energy of the plasma exhaust directed into the feedstock material could produce chemical reactions resulting from shock impact or thermal conduction. Certain feedstock material might be injected into the drift chamber 256 near the apertures 246 and 248 (FIG. 15) so as to form a cooling blanket between the plasma jet stream and the wall surrounding the drift region 256. In addition to protecting the wall in the drift section, the feedstock material could interact with the plasma jet producing thermo-chemical reactions. If the feedstock material were water, hydrogen and oxygen gases would result.

Since PLASMAKS can be formed with potentially long lives, there is sufficient time to exchange the thermonuclear fuel surrounding the mantle with feedstock material. For example, a slurry or fluid form of feedstock material such as a mixture of pulvarized coal and hydrogen gas can be injected under tremendous pressure into the pressure vessel illustrated in FIG. 12, thereby producing the compression needed to raise the PMK or PLASMAK to thermonuclear ignition. Pure thermonuclear fuel already existing in the primary mantle would be impeded from mixing with the injected feedstock by the compression intensified stray fields. The feedstock material would then comprise at least in part the gaseous and liquid regions 158 and 150 of FIG. 12. The relatively thin mantle 28 of the PMK would act as an ideal window for both Bremsstrahlung and particle radiation emanating from the fusion heated kernel. And further, the burning time is relatively long when compared with most chemical dissociative processes, and is certainly much longer than Bremsstrahlung and particle heating times associated with laser fusion pulses. And this process would be amenable to PLASMAKS utilizing clean exotic fuels. The action of Bremsstrahlung or particle radiation impinging upon hydrogen and pulvarized coal, for example, would be the production of synthetic petrofuels or the raw materials such as acetylene which are useful in the production of synthetic petrofuels.

After thermonuclear burnout, the energized feedstock material can be removed quickly, as through symmetrically disposed exhaust ports. Ohmic heating caused by the decomposing kernel magnetic fields as well as bombardment from energetic particles of the PMK would also tend to the formation of energetic chemical compounds. There are many other possibilities. For example, water heated in the vicinity of one thousan degrees Centigrade can be electrolyzed utilizing significantly less electrical energy. Such heating could occur in a secondary heat exchanger, and, of course, the electrical energy would be generated from PMK fusion energy. Many other possibilities for efficient conversion of the energy of this device can be readily seen by those skilled in the art of energy conversion, production of energetic chemicals, and reduction of metal oxides.

Numerous modifications and variations of the present invention are possible. For example, in the embodiment of FIG. 9 the plasma gun can be removed, and a toroidal plasmoid can be generated simply by the use of a high energy coil in the pressure of a preionized atmosphere of the type illustrated in FIG. 9. With this modification, however, it is necessary to provide an external field for moving the torodial plasmoid from the air core of the coil 76 to an appropriate position near the center of the pressure vessel 64, so that the toroid will be symmetrically disposed within the shock wave 92, when it is generated.

Recall that an immature mantle like structure embedded in its formation atmosphere can be produced independently of a kernerl 36 see FIG. 7 in the apparatus of FIG. 8. Such a structure could be trapped or confined and removed from its surrounding gas by magnetic or gaseous evacuating means. Injected into the apparatus of FIG. 9 and compressed it would in effect act as a toroidal plasmoid. This would be accomplished without the need of plasma gun 70 and with or without the need of coils 72 or auxiliary precompression or tractor coils (not shown).

It is also important to note that in the embodiment of FIG. 8, and in the previously described discharge method of generating the PMK, that the discharge between the electrodes 12 and 14 should occur at precisely the instant of maximum ionization of the helical path 20. Thus suitable timing and control equipment is preferably coupled between the ionization power source 58 and the high voltage switch 22 so that the high voltage switch 22 is closed at an appropriate instant after the ionization energy source is triggered.

Further, the method of FIG. 9 could be applied to the method of FIG. 8 whereby an ion beam, gas, or plasma jet could produce the matter for the helical discharge path in a heretofore evacuated chamber producing the mantle by means of a fluid pressure wave. This wave may be pre-ionized or pre-heated by electromagnetic wave or particle beam means in order to enhance the trapping of the magnetic fields associated with the forming ring.

In the embodiment of FIG. 9, the plasma gun 70 can be removed, and the aperture 72 sealed with a transparent partition of the type illustrated at 50 in FIG. 8. Thus an ionization energy source can be positioned outside the pressure vessel 64 to convert the apparatus of FIG. 9 to the same mode of operation as the apparatus of FIG. 8.

Furthermore, although the present invention is described with primary emphasis on its utility as a technique for studying a unique plasma configuration and for generating nuclear fusion energy, the present invention also has many additional uses. For example, the high energy PMK can be used as an extremely intense light source for the purpose of pumping lasers, or for any other purpose. Similarly, the PMK can be used as an intense electromagnetic heat source. In addition, the PMK can be used as a device for storing and transferring large quantities of electromagnetic energy which exist for brief intervals. In addition, the PMK can be used as a device for simulating other types of high energy magnetic and electromagnetic phenomena as well as stellar phenomena. Many additional uses of the PMK and the described methods and apparatus for generating it will be readily apparent to those skilled in the art.

It is noted that sustained fusion reactions can be maintained according to the method and apparatus of the present invention by proper manipulation of fuel materials. Selection of the proper materials permits a small quantity of raw fuel nuclei to continuously diffuse into the high temperature plasma to maintain the fusion reaction or to be injected by beam or pellet techniques, as is well known to those skilled in the art.

The language, definitions, and meanings of terms used in this developing technology are still being formulated. Some have been introduced herein for the first time. The older meanings of ionized gas or plasma were taken to be crudely equivalent (Cobine, 1941). Now, however, plasma includes the concept and meaning of electron gases in metals or semiconductors (Kittel, 1971) so that deformable solid or liquid conductors in intense magnetic fields are included. The net charge of the plasma is now taken to range from generally neutral (Cobine, 1941) to highly non-neutral (Malmberg, 1977).

The term "ionized gas" is familiar to a broader collection of people. The high density radiation flux from a compression heated kernel undergoing a fusion burn impinging upon the first wall or mantle would certainly bring that inner surface to the state generally describable by the term "ionized gas". And further, in the best mode of practice, the preferred initial state of matter of the instant invention for the primary mantle is that of an ionized gas maintained by intense, energetic currents. Therefore, to convey the concept of the mantle, the phrase "mantle of ionized particles" may be helpful to visualize it. In practice many other conducting configurations are workable. The efficacy of the three dimensional lever and fulcrum pressure multiplications makes it possible to obtain positive thermonuclear yields from considerably degraded PMKs.

As we have seen the disclosed plasma configuration and reactor vessels and systems have utility beyond their primary intended electrical or thermal usage as nuclear fusion reactors. Specifically, they can be used in a number of important chemical reactions, both atomic and nuclear, such as the production of artificial petroleum products and transmutation of elements.

It is also noted that the medium in which the PLASMAK is formed may be made up of a number of different types of materials. For example, the medium may consist of vaporized or plasmatized solid or liquid state matter containing light fusionable nuclear material. It may also be formed of a gas, an ionized gas or a plasma of light fusionable material, as well as a mixture of states of matter of light fusionable nuclei or a solid filament of boron powder in protium gas. In addition, in certain applications such as socket engines a fuel with a high reaction powder density is preferably used in the toroidal plasmoid while a fuel of low ignition point is preferably used in the mantle. The mantle fuel maybe preferably selected to react exothermically with neutrons or other emissions from the toroidal plasmoid.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of producing a compound plasma configuration in an enclosed region comprising the steps of:
   providing a suitable fluid medium in said region;
   producing a predetermined electrical environment in at least a portion of said region,
   establishing a magnetic field oriented in a particular direction within said region,
   producing a current stroke having an electromotive force in said fluid medium; and
   inducing said current stroke to follow a generally helical path.

2. A method as in claim 1 further comprising the step of:
   inducing said current stroke to form a closed loop, thereby forming a generally toroidal closed plasmoid.

3. A method as in claim 2, further comprising the step of:
   continuously circulating said fluid mediu for purification.

4. A method as in claim 2, wherein said step of producing a predetermined electrical environment includes the step of:
   producing a charge reservoir in at least a portion of said region.

5. A method as in claim 2, wherein said step of producing a predetermined electrical environment includes the step of:
   feeding at least one current wave pulse of relativistic charge into at least a portion of said region.

6. A method as in claim 5, further comprising the step of:
   creating a current vortex by appropriately directing said current wave pulse.

7. A method as in claim 2, further comprising the step of:
   creating a low pressure channel bordered by a layer of ionized particles in said fluid medium prior to said step of inducing said current stroke to form a closed loop.

8. A method as in claim 2, further comprising the steps of:
utilizing the electromotive force of said current stroke to induce currents forming a conducting sheath at the interface of said current stroke and said fluid medium surrounding said current stroke;
utilizing existing pressures and forces between said current stroke and said sheath to substantially displace said medium and said sheath from a channel formed by said current stroke, leaving an evacuated magnetic field region in its place;
terminating said current stroke so as to allow portions of said sheath associated with said helical channel section to transform into a mantle by substantially enclosing said evacuated magnetic field region surrounding said forming closed plasmoid and thereby forming said compound plasma configuration.

9. A method as in claim 1 wherein said step of producing includes the step of:
utilizing a plurality of current strokes.

10. A method as in claim 2, further comprising the steps of:
utilizing the electromotive force of said current stroke to induce currents forming a conducting sheath at the interface of said current stroke and said fluid medium surrounding said current stroke;
utilizing existing pressures and forces between said current stroke and said sheath to substantially displace said medium and said sheath from a channel formed by said current stroke, leaving an evacuated magnetic field region in its place;
terminating said current stroke so as to allow portions of said sheath associated with said helical channel section to transform into a mantle by substantially enclosing said evacuated magnetic field region surrounding said forming closed plasmoid and thereby forming said compound plasma configuration;
forming said toroidal plasmoid and said mantle of light fushionable nuclear material, said step of forming including the steps of
utilizing a fuel with a high reaction power density in said toroidal plasmoid,
utilizing a fuel of a low ignition point in said mantle,
selecting as said fuel of said mantle a fuel which reacts exothermically with neutrons and other emissions from said toroidal plasmoid, and
inducing vorticity in said current stroke to produce currents of generally helical transform within said toroidal plasmoid.

11. A method as in claim 2, further comprising the steps of:
utilizing the electromotive force of said current stroke to induce currents forming a conducting sheath at the interface of said current stroke and said fluid medium surrounding said current stroke;
utilizing existing pressures and forces between said current stroke and said sheath to substantially displace said medium sand said sheath from a channel formed by said current stroke, leaving an evacuated magnetic field region in its place;
terminating said current stroke so as to allow portions of said sheath associated with said helical channel section to transform into a mantle by substantially enclosing said evacuated magnetic field region surrounding said forming closed plasmoid and thereby forming said compound plasma configuration;
forming said toroidal plasmoid and said mantle of light fushionable nuclear material, said step of forming including the steps of
utilizing a fuel with a high reaction power density in said toroidal plasmoid,
utilizing a fuel of a low ignition point in said mantle,
selecting as said fuel of said mantle a fuel which reacts exothermically with neutrons and other emissions from said toroidal plasmoid,
utilizing at least one technique of generating energized particles selected from the group consisting of producing a high voltage pulse, producing an EMF wavefront, injecting charged particle beam current pulses, forming charged particle waves and injecting pulses of ionizing energy.

12. A method as in claim 8, further comprising the steps of
increasing the pressure within said enclosed region so as to effect three dimensional compression of said mantle and said closed plasmoid therein.

13. A method as in claim 12, further comprising the step of:
protecting the walls of said enclosed region from radiation and chemical, electromagentic and particle bombardments by injecting an energy absorbing medium between the walls of said compression apparatus and said compound plasma; and circulating a cooling medium within or over said walls.

14. A method as in claim 2, further comprising the steps of:
forming a mantle plasma around said closed plasmoid,
compressing said mantle plasma with non-magnetic energy whereby said closed plasmoid is also compressed.

15. A method as in claim 2, further comprising the steps of:
forming a mantle plasma around said closed plasmoid to complete said compound plasma configuration, physically moving said compound plasma configuration to a chamber separated from said region; and,
reestablishing said fluid medium in said region permitting repetition of said steps for producing a compound plasma.

16. A method as in claim 2 further comprising the step of:
increasing the temperature of said closed plasmoid by self compression heating.

17. Apparatus for generating and utilizing a compound plasmoid, comprising:
a forming chamber,
power supply means coupled to said chamber for producing a current stroke therein;
means associated with said chamber for inducing at least a portion of said current stroke to follow a generally helical path in said atmosphere;
field producing means associated with said chamber for producing a field oriented in a particular direction within said chamber.

18. An apparatus as in claim 17, further comprising:

charge source means associated with said chamber for injecting a quantity of charge into said chamber.

19. An apparatus as in claim 18, where said means for inducing includes:
radiant energy source means associated with said chamber for forming a helical path of reduced breakdown resistance.

20. Apparatus as in claim 19 wherein:
said power supply means includes a voltage source coupled to said chamber, control means coupled to said voltage source and a pair of electrodes coupled to said voltage source and mounted within said chamber, one of said electrodes having a central aperture therein,
said charge source means including a charged particle beam gun aligned with said aperture for directing a charged particle beam through said aperture,
said field producing means includes a coil wound about the exterior of said chamber and oriented such that said particular direction of said field is parallel to said beam gun alignment,
said radiant energy source means includes an optical flash lamp, a power supply coupled to said lamp, an optically transparent window in a wall of said chamber and an optical mirror designed to focus at a central region within said chamber.

21. Apparatus as in claim 19, further comprising:
aperture means coupled to said chamber for permitting energetic particles to escape from said chamber at a controlled rate.

22. Apparatus as in claim 21, wherein said aperture means includes:
control means connected to said aperture means for varying said controlled rate.

23. Apparatus for generating and utilizing a compound plasmoid comprising:
a forming chamber;
power supply means coupled to said chamber for producing a current stroke therein,
means associated with said chamber for inducing said current stroke to follow a generally helical path in said chamber,
detachable high pressure chamber means adapted to be coupled to said forming chamber for receiving compound plasmoids generated in said forming chamber.

24. An apparatus as in claim 23, further comprising:
coolant bath means surrounding said detachable high pressure chamber means.

25. Apparatus for generating and utlizing a compound plasmoid comprising:
a forming chamber;
power supply means coupled to said forming chamber for porducing a current stroke therein,
means associated with said forming chamber for inducing said current stroke to follow a generally helical path in said chamber,
a plurality of compression chamber means coupled to said forming chamber for receiving compound plasmoids formed in said forming chamber.

26. An apparatus as in claim 25, further comprising:
compound plasmoid movement means coupled to said compression chamber means for moving formed plasmoids into said compression chamber means.

27. An apparatus as in claim 26, further comprising:
closure means for isolating said forming chamber from said compression chambers.

28. An apparatus as in claim 27, further comprising:
energy transfer means coupled to said compression chamber means.

29. Apparatus as in claim 25 wherein:
at least one of said plurality of compression chambers is detachable from said forming chamber.

30. Apparatus as in claim 25, further comprising:
aperture means coupled to said compression chamber means for permitting energetic particles to escape at a controlled rate.

31. Apparatus as in claim 30, further comprising:
control means coupled to said aperture means for varying said controlled rate.

32. Apparatus as in claim 28, wherein:
said forming chamber is located to allow direct communication with said compression chamber means,
closure driver means coupled to said closure means for actuating said closure means in a properly timed sequential manner,
compression means coupled to said plurality of compression chamber means for increasing pressure therein; and,
timer means coupled to said compound plasma movement means for moving compound plasmas in timed sequence into said compression chamber means.

33. Apparatus for generating and utilizing a compound plasmoid comprising:
a forming chamber;
power supply means coupled to said chamber for producing a current stroke therein,
means associated with said chamber for inducing said current stroke to follow a generally helical path in said chamber,
pressure chamber means adapted to be coupled to said forming chamber for receiving compound plasmoids generated in said forming chamber; and
aperture means coupled to said pressure chamber means for permitting energetic particles to escape from said pressure chamber means at a controlled rate.

34. Apparatus as in claim 33, further comprising:
control means coupled to said aperture means for varying said controlled rate.

* * * * *